(12) United States Patent
Iwamuro

(10) Patent No.: US 8,188,511 B2
(45) Date of Patent: May 29, 2012

(54) SEMICONDUCTOR DEVICE AND METHOD OF MANUFACTURING THEREOF

(75) Inventor: Noriyuki Iwamuro, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 44 days.

(21) Appl. No.: 12/131,114

(22) Filed: Jun. 1, 2008

(65) Prior Publication Data

US 2008/0303057 A1     Dec. 11, 2008

(30) Foreign Application Priority Data

Jun. 7, 2007   (JP) .................................. 2007-152015

(51) Int. Cl.
*H01L 29/739* (2006.01)
*H01L 21/331* (2006.01)

(52) U.S. Cl. . 257/141; 257/139; 257/328; 257/E29.197; 257/E21.382

(58) Field of Classification Search .......... 257/138–141, 257/173, 174, 328, 331, 332, 378, 579, E29.197, 257/E21.382, E29.202, E29.133
See application file for complete search history.

(56) References Cited

U.S. PATENT DOCUMENTS

| 5,554,862 | A * | 9/1996 | Omura et al. | 257/137 |
| 5,796,125 | A | 8/1998 | Matsudai et al. | |
| 2003/0209781 | A1 * | 11/2003 | Hattori | 257/565 |
| 2008/0265278 | A1 * | 10/2008 | Hara et al. | 257/141 |
| 2009/0008675 | A1 * | 1/2009 | Lu | 257/141 |
| 2009/0020852 | A1 * | 1/2009 | Harada | 257/579 |

FOREIGN PATENT DOCUMENTS

| JP | 2-180074 A | 7/1990 |
| JP | 8-88357 A | 4/1996 |
| JP | 9-74197 A | 3/1997 |
| JP | 2006-5175 A | 1/2006 |
| WO | WO/2007/043170 | * 4/2007 |

OTHER PUBLICATIONS

Mok et al.; "A Self-Aligned Trenched Cathode lateral Insulated Gate Bipolar Transistor with High Latch-Up Resistance"; IEEE Transactions on Electron Devices; Dec. 1995; pp. 2236-2239; vol. 42, No. 12.
Hong-Fei Lu et al.; "A Low On-Resistance High Voltage SOI LIGBT with Oxide Trench in Drift Region and Hole Bypass Gate Configuration"; IEEE IEDM Tech. Dig.; pp. 393-396; 2005.
Cai et al.; "A New Lateral Trench-Gate Conductivity Modulated Power Transistor"; IEEE Transactions on Electron Devices, Aug. 1999; pp. 1788-1793; vol. 46, No. 8.

(Continued)

*Primary Examiner* — Victor A Mandala
*Assistant Examiner* — Whitney T Moore
(74) *Attorney, Agent, or Firm* — Rossi, Kimms & McDowell LLP

(57) ABSTRACT

A semiconductor device and a method of forming the semiconductor device include a substrate and an n drift layer on the substrate with an insulator film placed between them. A trench is provided in a section between a p base region and an n buffer layer on the surface layer of the n drift layer. Moreover, the distance between the bottom of the trench and the insulator film on the substrate is 1 μm or more and 75% or less than the thickness of the n drift layer. This reduces the ON-state Voltage Drop and enhances the device breakdown voltage and the latch up current in a lateral IGBT or a lateral MOSFET.

18 Claims, 16 Drawing Sheets

OTHER PUBLICATIONS

Disney et al.; "SOI LIGBT Devices with a Dual P-Well Implant for Improved Latching Characteristics"; Proceedings of ISPSD '93; 1993; pp. 254-258; Stanford CA.

Sumida et al.; "A High-Voltage Lateral IGBT with Significantly Improved On-State Characteristics on SOI for an Advanced PDP Scan Driver IC"; IEEE International SOI Conference Oct. 2, 2002; pp. 64-65.

* cited by examiner

SEMICONDUCTOR DEVICE AND METHOD OF MANUFACTURING THEREOF

BACKGROUND

In general, a high voltage switching device, provided on an SOI (Silicon On Insulator) substrate, is used at an output stage of a driver IC in a flat panel display such as a plasma display or of an IC for a vehicle. As a certain kind of such a device, an IGBT having a MOS driving device and a bipolar transistor merged together. An IGBT has the advantages of being simple in the arrangement of a driving circuit like a MOS driving device and being low in on-resistance due to conductivity modulation in a voltage blocking section like a bipolar transistor. Therefore an IGBT is regarded as being important in a field requiring a high breakdown voltage and a high electric power level.

In the following, a structure of a related IGBT will be explained. In the specification, a leading character "n" or "p" attached to names of semiconductor layers and regions means that electrons or holes, respectively, are majority carriers in the layers and the regions. Moreover, a sign "+" attached to the leading character "n" or "p" like "$n^+$" or "$p^+$" represents that the impurity concentrations in the semiconductor layer and the region with the sign are comparatively higher than those in layers and regions without the sign, and a sign "−" attached to the leading character "n" or "p" like "$n^-$" or "$p^-$" represents that the impurity concentrations in the semiconductor layer and the region with the sign are comparatively lower than those in layers and regions without the sign.

FIG. 15 is a cross-sectional view showing a structure of a related lateral IGBT. See for example H. Sumida, A. Hirabayashi, and H. Kobayashi, *A High-Voltage Lateral IGBT with Significantly Improved On-State Characteristics on SOI for an Advanced PDP Scan Driver IC*, 2002 IEEE International SOI Conference, pp. 64-65, 2002. As shown in FIG. 15, an SOI substrate has a structure in which an $n^-$ drift region 203 (to be an active region) is layered on a substrate 201 with an insulator film 202 provided between them. Therefore, the insulator film 202 insulates the substrate 201 and the $n^-$ drift region 203 from each. In part of the surface layer of the $n^-$ drift region 203, a p base region 204 is provided. In part of the surface layer of the p base region 204, an $n^+$ source region 205 and a $p^+$ contact region 206 with a high impurity concentration are provided. The $p^+$ contact region 206 is adjacent to the $n^+$ source region 205. Part of the $p^+$ contact region 206 occupies part of the section beneath the $n^+$ source region 205.

In part of the surface layer of the $n^-$ drift region 203, a $p^+$ collector region 207 is provided apart from the p base region 204. Moreover, in the $n^-$ drift region 203, an n buffer region 208 is provided to surround the $p^+$ collector region 207. The n buffer region 208 has an impurity concentration higher than that of the $n^-$ drift region 203. On the surface of the SOI substrate, an emitter electrode 209 is provided to short circuit the $n^+$ source region 205 and the $p^+$-contact region 206. Over the surfaces of the $n^-$ drift region 203, the p base region 204, and the $n^+$ source region 205, a control electrode 211 is provided with an insulator film 210 placed between the electrode 211 and the regions 203, 204, and 205.

As shown in FIG. 15, in the related IGBT 200, a first bipolar transistor is formed with the p base region 204, the $n^-$ drift region 203, the n buffer region 208, and the $p^+$ collector region 207. Moreover, a second bipolar transistor is formed with the $n^+$ source region 205, the p base region 204, and the $n^-$ drift region 203. The first bipolar transistor and the second bipolar transistor form a parasitic thyristor. For avoiding occurrence of latch-up of the thyristor, restriction is imposed on the upper limit of an on-current.

Several methods are proposed for raising the upper limit of an on-current. D. R. Disney and J. D. Plummer, *SOI LIGBT Devices with a Dual P-Well Implant for Improved Latching Characteristics*, Proceedings of ISPSD '93, pp. 254-258, 1993, for example, discloses a method of reducing resistance of a path leading from the side of the end of the channel beneath the $n^+$ source region 205 to the $p^+$ contact region 206. According to this method, the operation of the second bipolar transistor can be controlled.

The IEEE publication by Philip K. T. Mok, Azzouz Nazar, and C. André T. Salama, *A Self-Aligned Trenched Cathode Lateral Insulated Gate Bipolar Transistor with High Latch-Up Resistance*, IEEE Transactions on Electron Devices, Vol. 42, No. 12, pp. 2236-2239, December 1995, for example discloses, eliminating inaccuracy in mask alignment in forming the $p^+$ collector region 207 to minimize the lengths of the paths in the first bipolar transistor and the second bipolar transistor, making the $p^+$ collector region 207 self-aligned with a gate electrode. Furthermore, the IEEE publication by Jun Cai, Johnny K. O. Sin, Philip K. T. Mok, Wai-Tung Ng, and Peter P. T. Lai, *A New Lateral Trench-Gate Conductivity Modulated Power Transistor*, IEEE Transactions on Electron Devices, Vol. 46, No. 8, pp. 1788-1793, August 1999, for example discloses a method of making most of carriers, flowing into the $n^-$ drift region 203 from the $p^+$ collector region 207, reach the $p^+$ contact region 206 without letting the carriers pass through the path in the first bipolar transistor or the second bipolar transistor.

The related lateral IGBT 200 as shown in FIG. 15, however, is prone to an unbalanced electric current distribution in the device even with the use of the methods as described in the above references because most of the current flows on the surface of the device when the device is brought into conduction. This causes the following problems. First, the $n^-$ drift region 203 is not uniformly conductivity modulated therein to cause its ON-state Voltage Drop to become higher. Secondly, most of the current flows on the surface of the device, making the current easily flow beneath the $n^+$ source region 205. Thus, the problem of causing latch-up exists. Thirdly, in designing a high breakdown voltage device, the $n^-$ drift region 203 is arranged along the surface of the device, requiring a longer $n^-$ drift region 203. Therefore, when the related lateral IGBT 200 requires a large amount of current with a high breakdown voltage, there are problems associated with the increased ON-state Voltage Drop and the increased chip area.

For solving such problems, the references JP-A-2-180074 and David Hongfei Lu, Shinichi Jimbo and Naoto Fujishima, *A Low On-Resistance High Voltage SOI LIGBT with Oxide Trench in Drift Region and Hole Bypass Gate Configuration*, IEEE IEDM Tech Dig., pp. 393-396, 2005, for example, disclose a method of forming an insulator region in the $n^-$ drift region 203. According to the method, the $n^-$ drift region 203 is made to have a bent configuration to increase its drift length without increasing the horizontal dimensions of the $n^-$ drift region 203. Moreover, JP-A-8-88357 (corresponding to U.S. Pat. No. 5,796,125), for example, discloses forming a trench in the $n^-$ drift region 203 and forming, under the trench, a by-pass layer of a first conductivity type with the resistivity lower than that of the $n^-$ drift region 203. According to this reference, an electron current flows in the by-pass layer, so that the current is not reduced to therefore reduce the ON-state Voltage Drop of the device.

In addition, JP-A-2006-5175, for example, discloses a structure in which a field plate is buried in a trench formed in the n⁻ drift region 203. According to the structure, the electric field strength around the opening of the trench can be lessened.

Furthermore, JP-A-9-74197 (also corresponding to U.S. Pat. No. 5,796,125), for example, discloses forming a gate electrode section to be a trench gate. FIG. 16 is a cross-sectional view showing the structure of a lateral IGBT with its gate electrode section formed to be a trench gate. The lateral IGBT 220 shown in FIG. 16 is, unlike the lateral IGBT 200 shown in FIG. 15, provided with a plurality of trenches 221 that penetrate through the p base region 204 from the surface of the n⁺ source region 205 and reach the n⁻ drift region 203. According to the method, the total channel width per unit area is increased. Therefore, the electron current from the MOSFET section is increased to reduce an ON-state Voltage Drop. Moreover, in comparison with the lateral IGBT 200 shown in FIG. 15, the current distribution in the device becomes uniform to result in uniform conductivity modulation. This also reduces the ON-state Voltage Drop of the device.

Each of the lateral IGBTs of related art explained above, however, when compared with a vertical IGBT, has a non-uniform current flow in the device with the conductivity modulation becoming also non-uniform. Thus, there are problems of the ON-state Voltage Drop becoming higher and the device breakdown voltage and latch up current becoming lower than those of a vertical IGBT. Moreover, when a component such as a field plate is additionally provided, the structure becomes more complicated, making the fabrication of the device more time-consuming. Furthermore, when a trench is formed in the drift region, the deepened trench depth increases the drift thickness, resulting in a raised ON-state Voltage Drop, which necessitates the depth of the trench to be kept in an adequate range.

There remains a need for a lateral semiconductor device with a low ON-state Voltage Drop and high device breakdown voltage and latch up current. The present invention addresses this need.

SUMMARY OF THE INVENTION

The present invention relates to a high breakdown voltage lateral semiconductor device having a MOS (Metal-Oxide-Semiconductor) structure, such as a lateral IGBT (Insulated Gate Bipolar Transistor) or a lateral MOSFET (Metal Oxide Semiconductor Field Effect Transistor), and a method its manufacture.

One aspect of the present invention is a semiconductor device. The device can include a substrate, a drift layer of a first conductivity type on the substrate with an insulator film therebetween, a base layer of a second conductivity type in the drift layer, a first layer of the first conductivity type in the base layer, a gate electrode over the surface of the base layer, between the drift layer and the first layer with a gate insulator film therebetween, a first electrode electrically connected to both the base layer and the first layer, a buffer layer of the first conductivity type in the drift layer and spaced apart from the base layer, a second layer of one of the first or second conductivity type in the buffer layer, a second electrode electrically connected to the second layer, and a trench between the base layer and the collector layer. The trench is filled with an insulator film. The distance between the bottom of the trench and the insulator film on the substrate is 1 μm or more and 75% or less of the thickness of the drift layer. The trench is spaced from the base layer.

The device can further include a gate trench penetrating through the base layer beneath the first layer and reaching the drift layer.

The first layer can be an emitter layer and the second layer can be a collector layer of the second conductivity type, and the first electrode can be an emitter electrode and the second electrode can be a collector electrode. Alternatively, the first layer can be a source layer and the second layer can be a drain layer of the first conductivity type, the first electrode can be a source electrode, and the second electrode can be a drain electrode.

The center line of the trench can be positioned within a range between one-third and two-thirds of the distance between a central position of the emitter or source electrode and a central position of the collector or drain electrode.

At least one of the gate electrode or the emitter electrode extends to the trench from above the trench. Alternatively, at least one of the gate electrode or the source electrode extends to the trench from above the trench.

The insulator film filling the trench can be a silicon oxide film. The gate insulator film also can be a silicon oxide film. Each of the substrate, the drift layer, the base layer, the first layer, the buffer layer, and the second layer can be made of silicon.

Another aspect of the present invention is a method of manufacturing the above described semiconductor device. The method can include providing the substrate, forming the insulator film on the substrate, forming the drift layer on the insulator film, forming the base layer in the drift layer, forming the first layer in the base layer, forming the gate electrode over the surface of the base layer, between the drift layer and the first layer with the gate insulator film therebetween, forming the first electrode electrically connected to both the base layer and the first layer, forming the buffer layer in the drift layer and spaced apart from the base layer, forming the second layer in the buffer layer, forming the second electrode electrically connected to the second layer, forming the trench between the base layer and the collector layer, and filling the trench with an insulator film. The distance between the bottom of the trench and the insulator film on the substrate is 1 μm or more and 75% or less of the thickness of the drift layer. The method can further include the step of forming the gate trench penetrating through the base layer beneath the first layer and reaching the drift layer.

DETAILED DESCRIPTION

Figure 1:
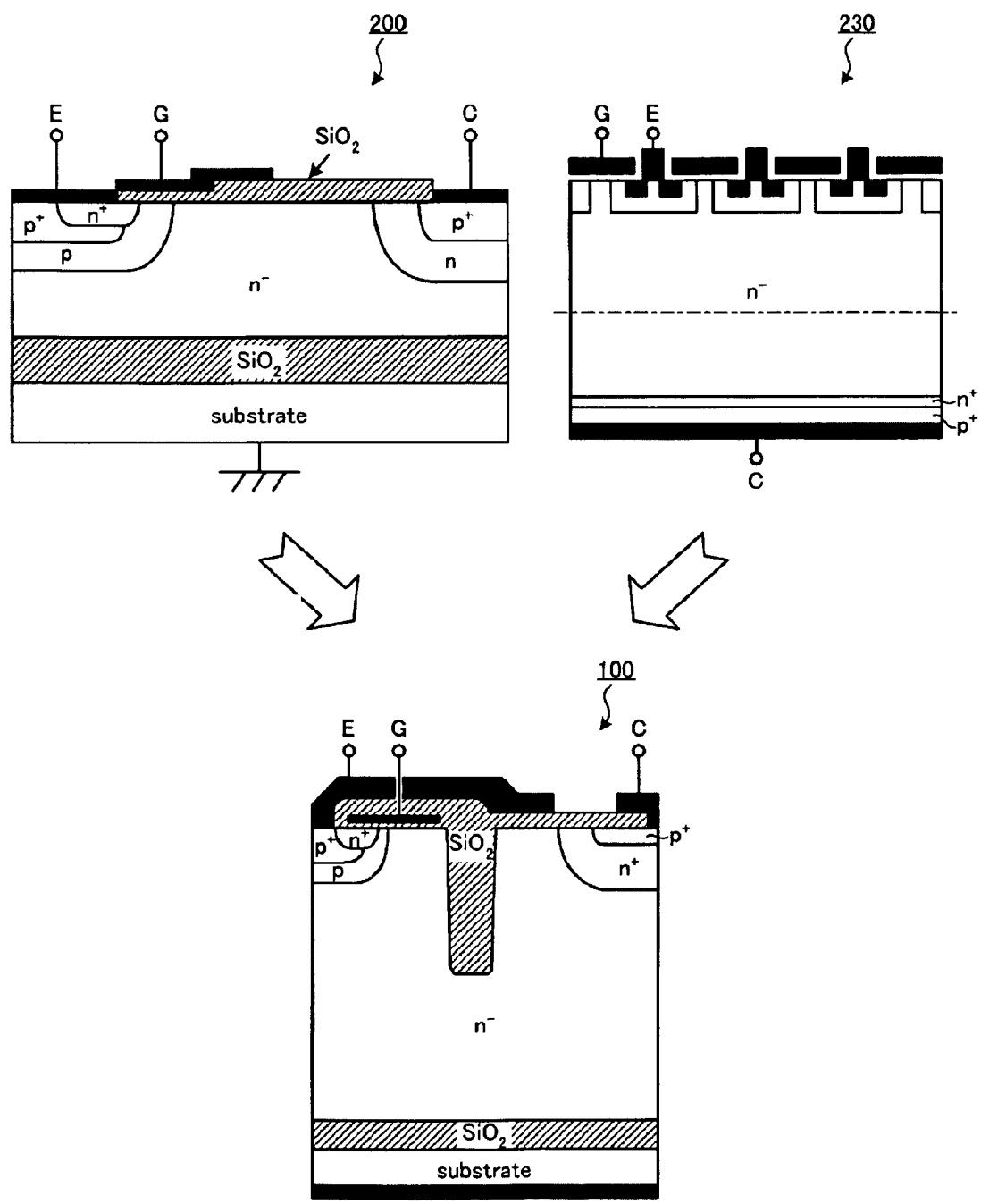
FIG. 1 schematically illustrates an outline according to a first embodiment of a semiconductor device according to the present invention.

In the following, the preferred embodiments of the semiconductor device according to the present invention will be explained in detail with reference to the attached drawings. In the explanations of the embodiments, similar arrangements will be denoted with the same reference numerals and signs.

Referring to FIG. 1, a semiconductor device 100 according to the first embodiment has a structure in which the characteristics of a related vertical IGBT 230 are added to the related lateral IGBT 200. For applying the characteristics of the vertical IGBT 230 to the related lateral IGBT 200, the semiconductor device 100 is configured so that the drift layer (n⁻-layer) of the vertical IGBT 230 is folded at around its center. Namely, a collector electrode (C) ordinarily positioned on the bottom surface of the device is brought to the top surface of the device so as to be provided there. Moreover, in the folded section of the drift layer, an insulator film ($SiO_2$-silicon oxide) with an SOI structure is buried.

Figure 2:
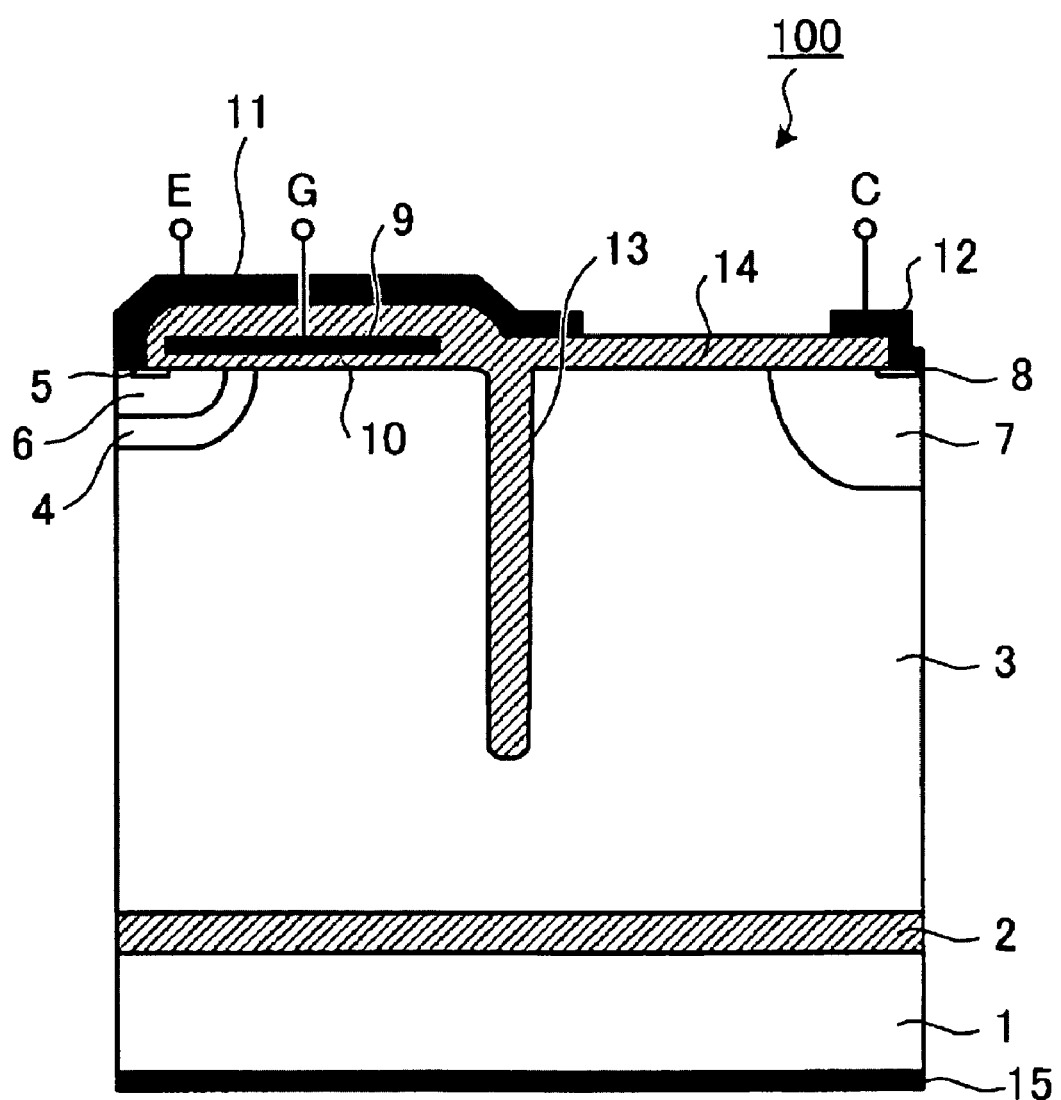
FIG. 2 schematically illustrates a cross-sectional view of the structure of the semiconductor device of FIG. 1.

Referring to FIG. 2, which is a cross-sectional view showing the structure of the semiconductor device 100 according to the first embodiment, the semiconductor device 100, which has a lateral IGBT structure, is fabricated using an SOI substrate. The SOI substrate has a structure in which an insulator film 2 and an n drift layer 3 are layered in this order on a substrate 1. The n drift layer 3 has a comparatively high resistivity. For example, the thickness and the specific resistance of the n drift layer 3 is 14 μm and 10 Ωcm, respectively. The thickness of the insulator film 2 is 1 μm, for example. Moreover, the insulator film 2 is made of a silicon oxide film, for example. Each of semiconductor layers in the SOI substrate is made of silicon, for example. For the SOI substrate, a substrate formed with semiconductor other than silicon and insulator films other than oxide films can be used.

A p base layer 4 is provided in part of the surface layer of the n drift layer 3. For example, the p base layer 4 has a diffusion depth of 2.0 μm and an impurity concentration of $2.5 \times 10^{17}$ cm$^{-3}$. An n emitter layer 5 is provided in part of the surface of the p base layer 4. For example, the n emitter layer 5 has a diffusion depth of 0.2 μm and an impurity concentration of $3.0 \times 10^{20}$ cm$^{-3}$. A p⁺ layer 6 is provided in contact with the n emitter layer 5 as a region with a high impurity concentration in the p base layer 4. The p⁺ layer 6 has lower resistivity than the p base layer 4. For example, the p⁺ layer 6 has a diffusion depth of 0.2 μm and an impurity concentration of $5.0 \times 10^{19}$ cm$^{-3}$.

An n buffer layer 7 is selectively provided in a part of the surface layer of the n drift layer 3 by a specified distance apart from the p base layer 4. The n buffer layer 7 has lower resistivity than the n drift layer 3. For example, the n buffer layer 7 has a diffusion depth of 2.9 μm and an impurity concentration of $1.0 \times 10^{17}$ cm$^{-3}$. A p collector layer 8 is provided in a part of the surface of the n buffer layer 7 in isolation from the n drift layer 3 by the n buffer layer 7. The p collector layer 8 has comparatively lower resistivity. For example, the p collector layer 8 has a diffusion depth of 0.12 μm and an impurity concentration of $7.0 \times 10^{17}$ cm$^{-3}$.

A gate electrode 9 is provided over the surfaces of the p base layer 4 and the p⁺ layer 6 that are positioned between the n emitter layer 5 and the n drift layer 3 and the surface of the n drift layer 3 in contact with the p base layer 4 with a gate oxide film 10 held between. The gate electrode 9 is made of, for example, polysilicon doped with phosphorus. The thickness of the gate oxide film 10 is, for example, on the order of 20 nm.

On the surface layer of the n drift layer 3, an oxide film 14 is layered. The oxide film 14 is, for example, a silicon oxide film. The oxide film 14 is selectively removed to provide openings. An emitter electrode 11 is provided so as to be in contact with the surfaces of the n emitter layer 5 and the p⁺ layer 6 at one of the openings of the oxide film 14. A collector electrode 12 is provided so as to be in contact with the surface of the p collector layer 8 at another opening of the oxide film 14. Moreover, a metal film 15 as an electrode is provided so as to be in contact with the bottom surface of the substrate 1.

A trench 13 is provided between the p base layer 4 and the n buffer layer 7 in the n drift layer 3. The trench 13 is filled with the oxide film 14. The width of the trench 13 is on the order of 1.6 μm at the surface and on the order of 1.45 μm at the bottom, for example. The depth of the trench 13 is 10 μm, for example. The trench 13 is formed so as to position at the middle of the distance from the center of the emitter electrode 11 to the center of the collector electrode 12. Specifically, when the pitch of a unit cell is 19.5 μm, the position of the center line of the trench 13 is at 9.75 μm from the center of the emitter electrode 11. Namely, the center line of the trench 13 coincides with the center line of the unit cell.

Here, an example of the method of forming the trench 13 will be explained. The trench 13 is formed by carrying out RIE (Reactive Ion Etching) of the n drift layer 3. In this case, damages left after the RI E are removed by carrying out thermal oxidation. Then, the trench 13 is filled with the oxide film 14 so as not to produce voids therein. The oxide film 14 is made of, for example, a TEOS (tetraethoxysilane) oxide film.

In the first embodiment, the MOSFET section is formed before the trench 13 is formed. Therefore, no gate electrode 9 can be formed above the trench 13. This makes the emitter electrode 11 provided with a shape largely extending to the collector side over the trench 13 with the oxide film 14 put between the trench 13 and the emitter electrode 11. Specifically, the emitter electrode 11 is provided with a shape extending by, for example, 1 μm from the collector side end of the trench 13 to the collector electrode 12 side. This is for reducing the electric field strength applied to the junction between the p base layer 4 and the n drift layer 3 when a voltage is applied to the collector electrode 12. The distance of the order of 1 µm is enough provided between the collector side end of the gate electrode 9 and the emitter side end of the trench 13.

Figure 3:
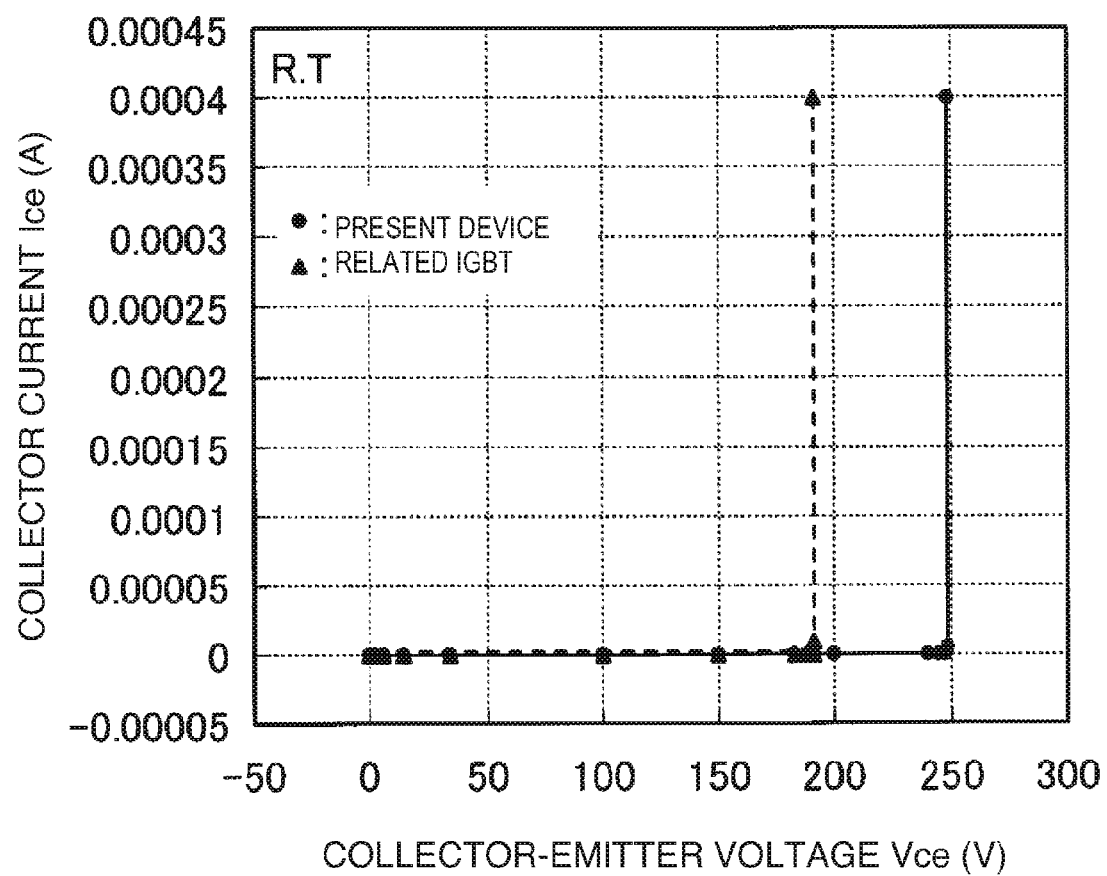
FIG. 3 is a characteristic diagram illustrating the device breakdown voltage characteristic of each of the semiconductor device according to the first embodiment and the related lateral IGBT.

Referring to FIG. 3, the device breakdown voltages of the semiconductor device 100 and the related lateral IGBT 200 will be explained. FIG. 3 is a characteristic diagram showing the device breakdown voltage characteristic of each of the semiconductor device 100 according to the first embodiment and the related lateral IGBT 200. In FIG. 3, the vertical axis represents the collector current Ice and the horizontal axis represents the collector-emitter voltage Vce. The plots with the marks ● and ▲ show the characteristics of the semiconductor device 100 according to the first embodiment and the related lateral IGBT 200, respectively. The thickness, resistivity, diffusion depth and impurity concentration of each of the layers in the related lateral IGBT 200 whose characteristic is shown in FIG. 3 are the same as those in the semiconductor device 100 according to the first embodiment.

Moreover, each of the semiconductor device 100 and the related lateral IGBT 200 is made to have an active area of 106 µm×670 µm and a rated current of 0.4 A, for example. For ensuring a breakdown voltage of 190V, the cell pitch of the related lateral IGBT 200 becomes 25.0 µm, which is 5.5 µm longer than the cell pitch (19.5 µm) of the semiconductor. With the cell areas of both of the devices being made equal, in the semiconductor device 100, its channel width can be lengthened by an amount of shortened cell pitch, which can reduce on-resistance. The measurements were carried out at a room temperature (25° C.). As shown in FIG. 3, the device breakdown voltage of the semiconductor device 100 becomes 248V, which is increased by +54V (+31%) compared with the device breakdown voltage (190V) of the related lateral IGBT 200. This is because the trench 13 formed in the active region and the oxide film 14 filling the trench sufficiently bears the collector-emitter voltage. As a result, the cell pitch of the semiconductor device 100 can be made small.

Figure 4:
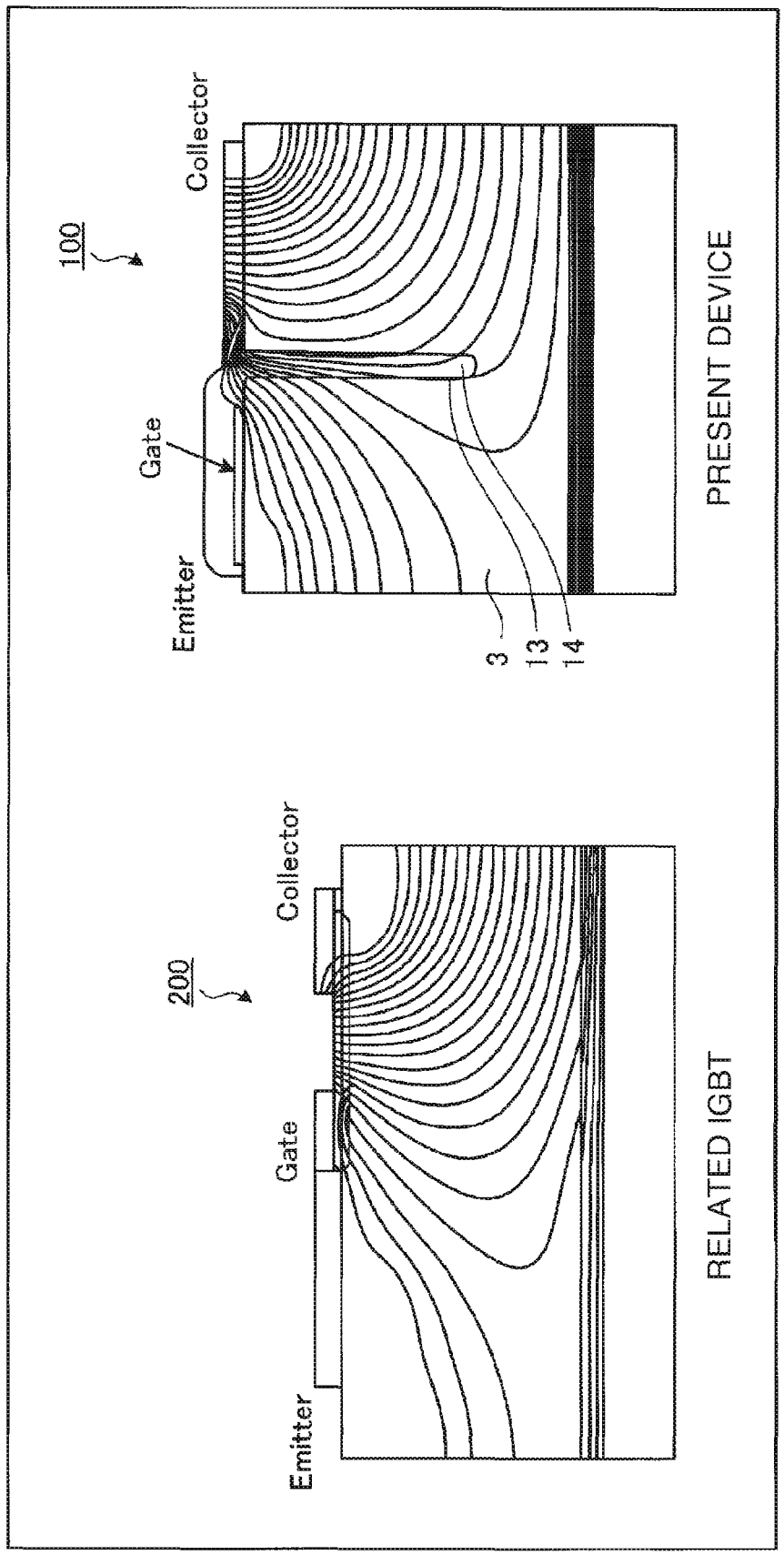
FIG. 4 illustrates the voltage distribution inside each of the semiconductor device according to the first embodiment and the related lateral IGBT.

Referring to FIG. 4, the results of analyses carried out by a device simulation of voltage distributions inside devices when a device breakdown voltage is applied between the collector and the emitter in each of the semiconductor device 100 and the related lateral IGBT 200 will be explained. FIG. 4 is an illustration showing the voltage distribution inside each of the semiconductor device 100 and the related lateral IGBT 200. As shown in FIG. 4, in the semiconductor device 100, more number of the electric lines of force pass through the trench 13 filled with the oxide film 14 in comparison with the number of the electric lines of force in the related lateral IGBT 200. Therefore, the oxide film 14 in the trench 13 bears a large part of the applied voltage to enhance the device breakdown voltage.

Figure 5:
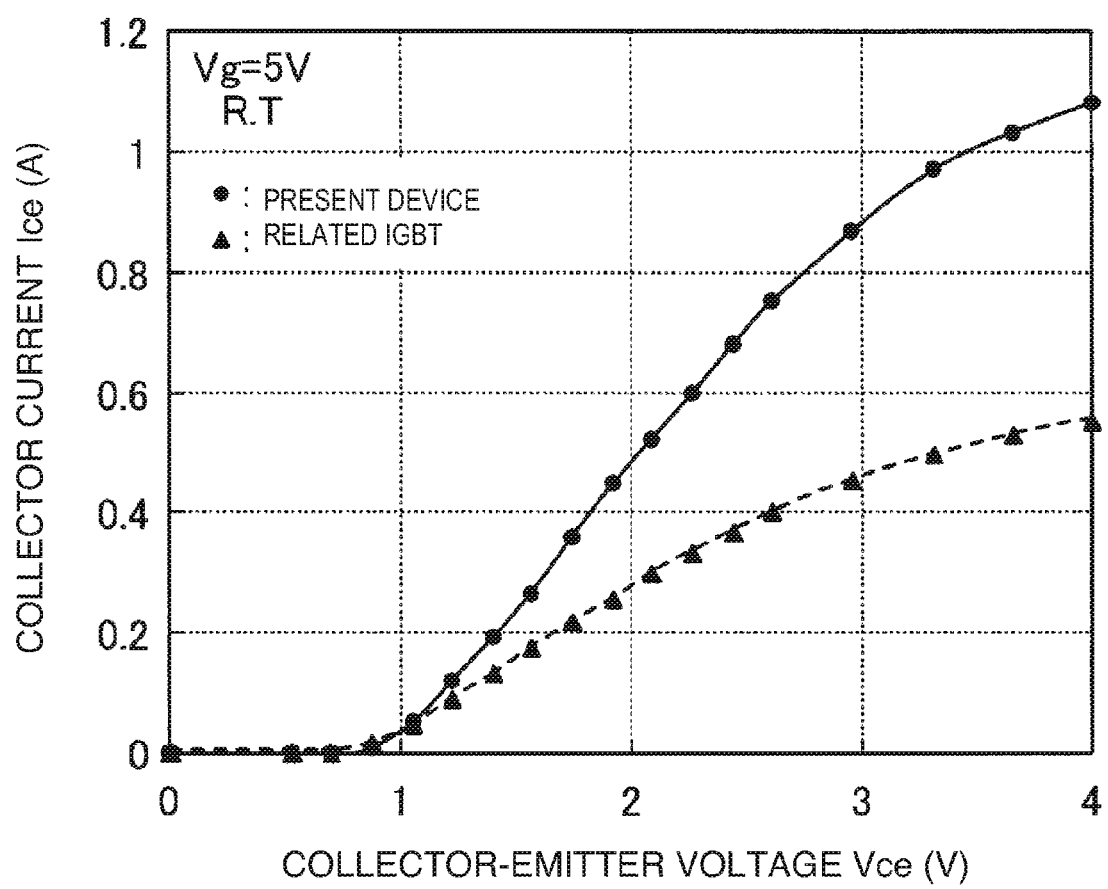
FIG. 5 is a characteristic diagram illustrating the I-V characteristic curve of the current conduction characteristic of each of the semiconductor device according to the first embodiment and the related lateral IGBT.

Referring to FIG. 5, the I-V characteristic curves of the current conduction characteristics of the semiconductor device 100 and the related lateral IGBT 200 are shown will be explained. FIG. 5 is a characteristic diagram showing the I-V characteristic curve of the current conduction characteristic of each of the semiconductor device 100 and the related lateral IGBT 200. In FIG. 5, the vertical axis represents the collector current Ice and the horizontal axis represents the collector-emitter voltage Vce. The plots with the marks ● and ▲ show the characteristics of the semiconductor device 100 according to the first embodiment and the related lateral IGBT 200, respectively.

As shown in FIG. 5, the ON-state Voltage Drop of the semiconductor device 100 is 1.84V. Here, the ON-state Voltage Drop is defined as a collector-emitter voltage Vce when a collector current of 0.4 A flows. The ON-state Voltage Drop of the semiconductor device 100 is reduced by 0.76V in comparison with the ON-state Voltage Drop (2.60V) of the related lateral IGBT 200. This makes it known that current conduction capability is significantly enhanced. Specifically, when a collector-emitter voltage Vce is given as Vce=2.6V, for example, the collector current Ice of the semiconductor device 100 becomes 0.75 A and the collector current Ice of the related lateral IGBT 200 becomes 0.4 A. Therefore, when a collector-emitter voltage Vce is given as Vce=2.6V, the collector current Ice of the semiconductor device 100 increases by 87.5% in comparison with the collector current Ice of the related lateral IGBT 200.

Figure 6:
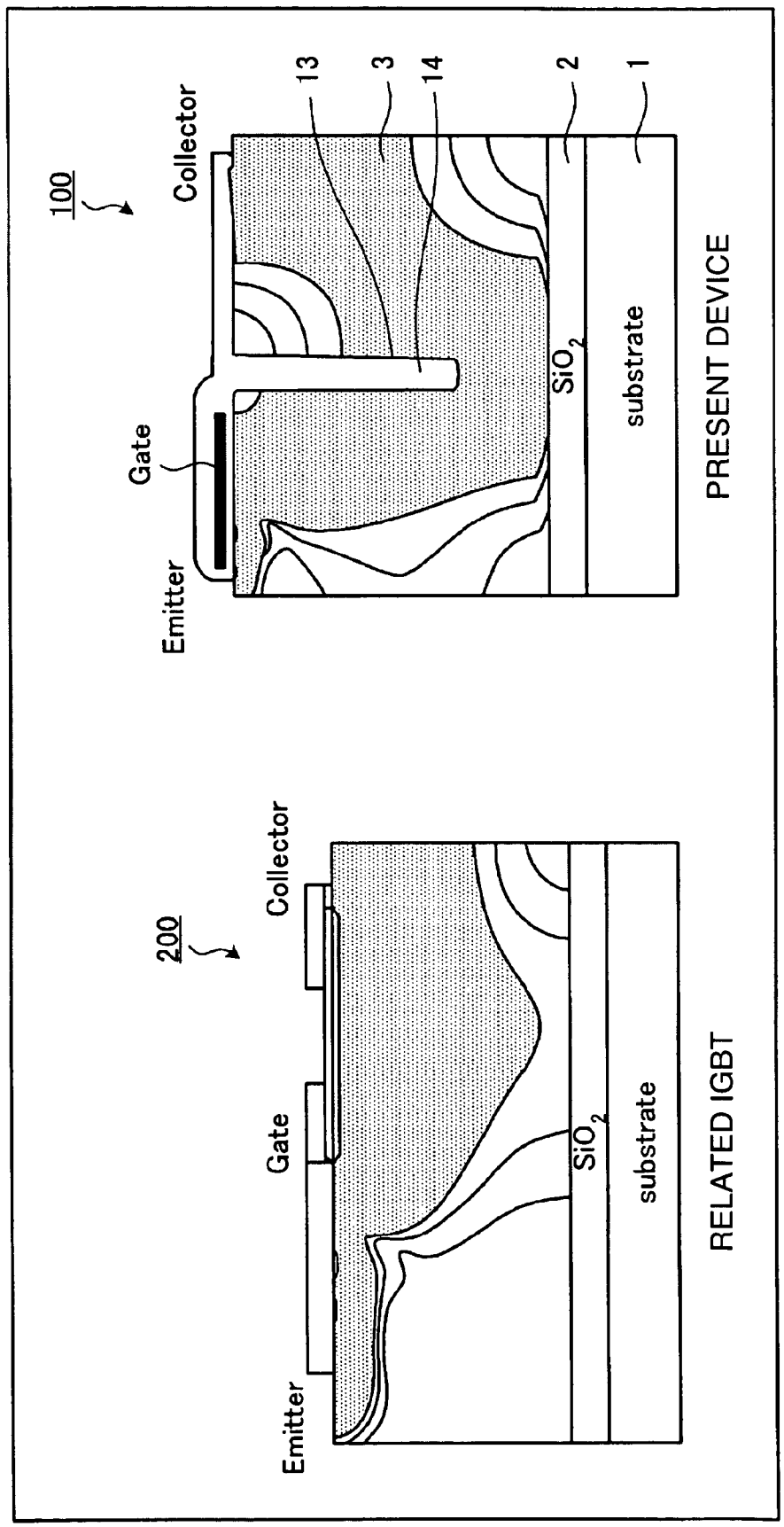
FIG. 6 illustrates the current distributions inside devices when a rated current is made to flow in each of the semiconductor device according to the first embodiment and the related lateral IGBT.

Referring to FIG. 6, the results of analyses carried out by a device simulation of current distributions inside devices when a rated current is made to flow in each of the devices will be explained. FIG. 6 is an illustration showing the current distributions inside devices when a rated current is made to flow in each of the semiconductor device 100 and the related lateral IGBT 200. In FIG. 6, an area with half-tone dot meshing in the figure is a current conducting region that conducts a current. As shown in FIG. 6, in the semiconductor device 100, current flows uniformly in the n drift layer 3 in comparison with the current flowing in the related lateral IGBT 200. This, together with the shortened cell pitch obtained by providing the trench 13 filled with the oxide film 14, improves a low ON-state Voltage Drop characteristic and a current conducting characteristic.

Figure 7:
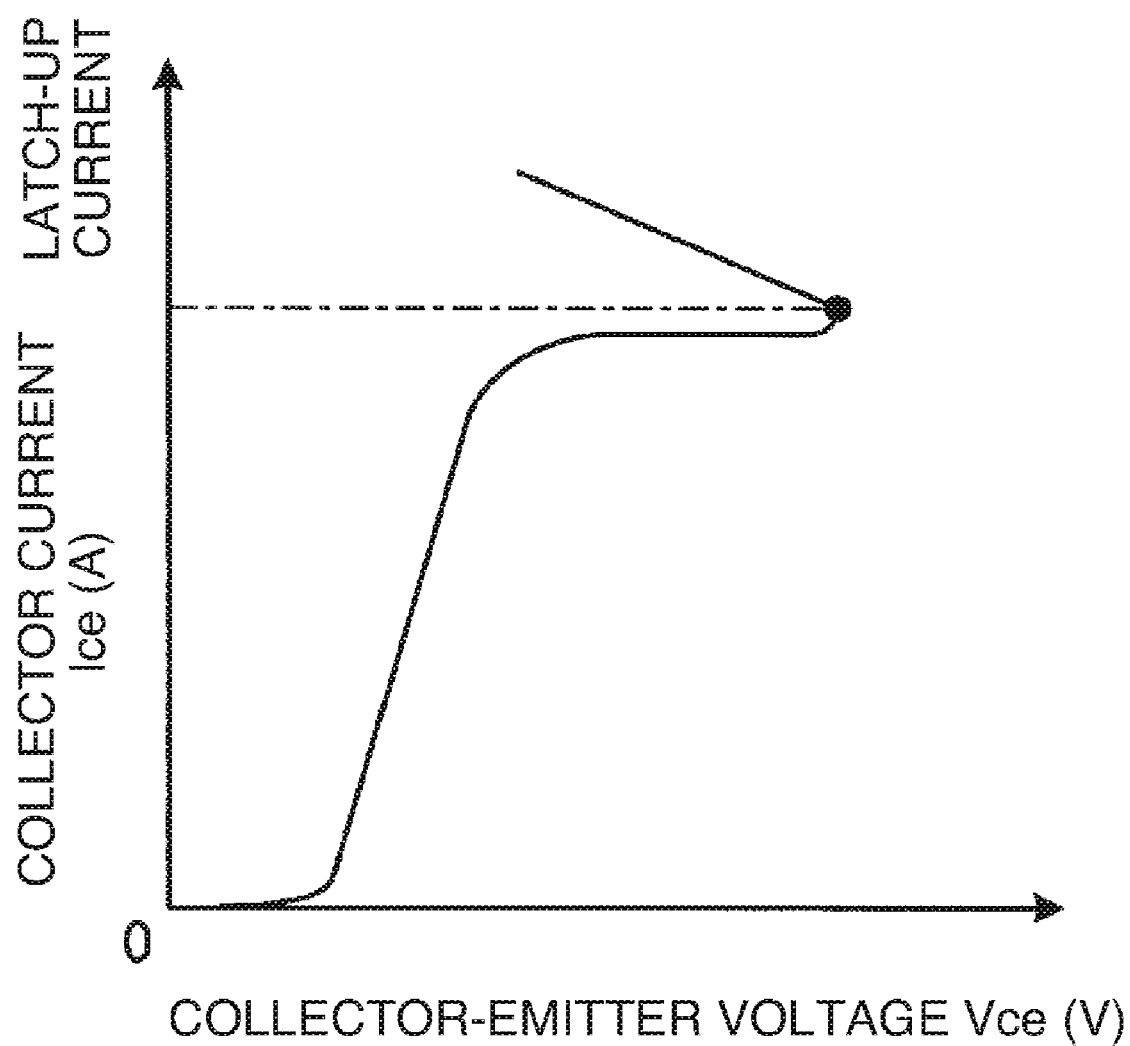
FIG. 7 is a characteristic diagram illustrating the latch-up current.

Referring to FIG. 7, the latch up current of the semiconductor device 100 will be explained. FIG. 7 is a characteristic diagram illustrating latch up current. In FIG. 7, the vertical axis represents the collector current Ice and the horizontal axis represents the collector-emitter voltage Vce. The latch up current is the value of the corrector current Ice at which negative resistance characteristic starts to appear in the I-V characteristic curve. Latch up currents of devices are evaluated by comparing their I-V characteristic curves when voltages are applied to their respective collector electrodes 12 with their respective temperature being 125° C. and their respective gate voltages Vg being 7V. With each of the devices brought into this state, more current is to flow in the device to facilitate the comparison of the latch up current.

The latch up current of the semiconductor device 100 becomes 4.30 A, which becomes approximately 1.9 times higher in comparison with the latch up current (2.25 A) of the related lateral IGBT 200. This is because the semiconductor device 100 is provided with the characteristics of a related vertical IGBT 230. This makes the flow of the current around the emitter electrode 11 differ from that in the related lateral IGBT 200 to reduce the hole current crossing under the n emitter layer 5.

Figure 8:
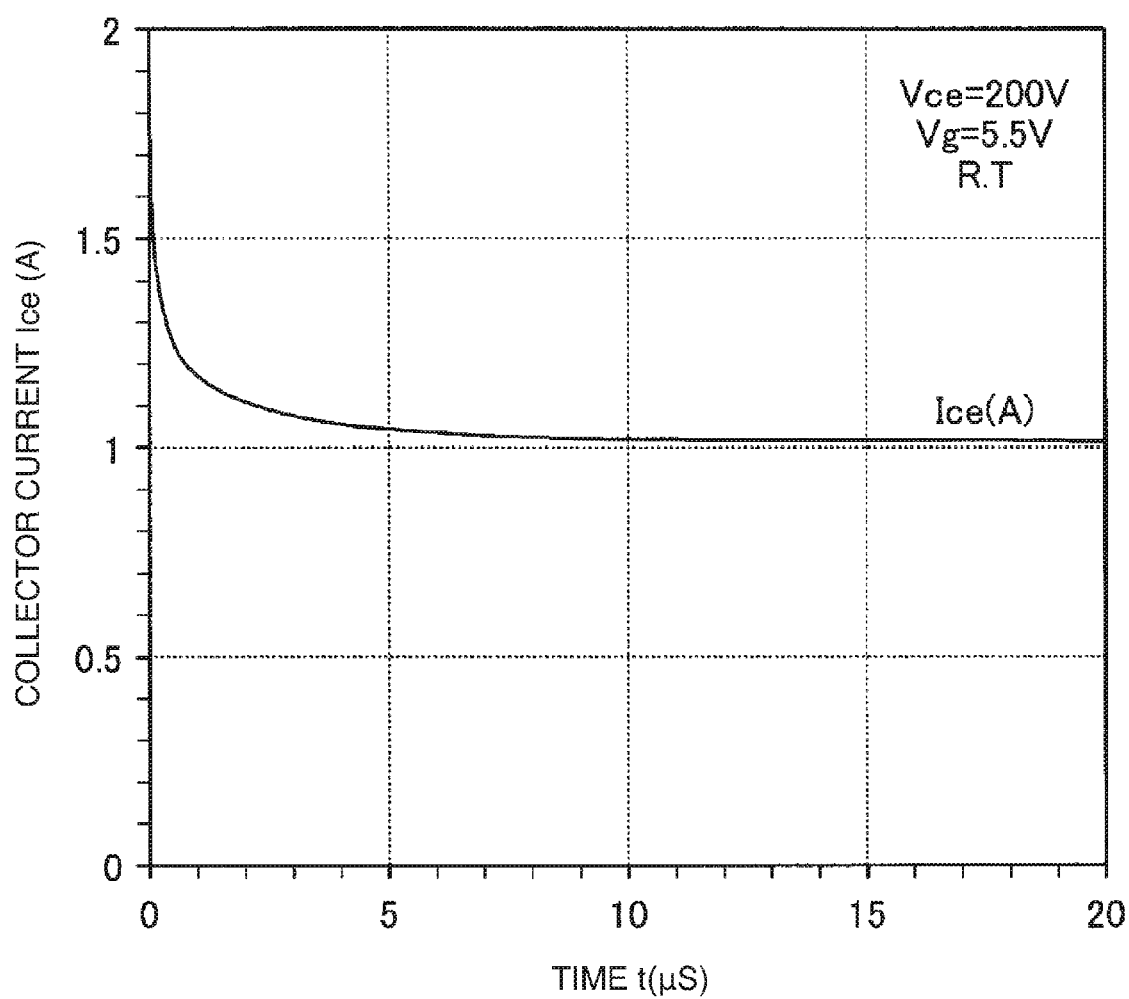
FIG. 8 is a characteristic diagram illustrating the load short-circuit blocking capability of the semiconductor device according to the first embodiment.

Referring to FIG. 8, the load short-circuit blocking capability of the semiconductor device 100 will be explained. FIG. 8 is a characteristic diagram showing the load short-circuit blocking capability of the semiconductor device 100. In FIG. 8, the vertical axis represents the collector current Ice and the horizontal axis represents a time t. Moreover, in FIG. 8, the device is in a state in which the collector-emitter voltage Vce given as Vce=200V is directly applied between the collector electrode 12 and the emitter electrode 11. The state is a no-load state that is in an arm short-circuit. Furthermore, with a gate voltage Vg applied as Vg=5.5V, a time t to the device breakdown was measured. As shown in FIG. 8, the load short-circuit blocking capability becomes more than 20 µsec. This is a value large enough as the load short-circuit blocking capability.

Referring to Tables 1-3, the relationship between the depth of the trench 13 and electrical characteristics in the semiconductor device 100 according to the first embodiment will be explained. Table 1 is a list of the results of measurements of relationships between the depth of the trench 13 and the electrical characteristics when the thickness of the n drift layer 3 is 14 µm in the semiconductor device 100. Here, the electrical characteristics are an ON-state Voltage Drop, a device breakdown voltage and a latch up current. As shown in Table 1, when the depth of the trench 13 is between 1 µm and 13 µm, the semiconductor device 100 is improved in the ON-state Voltage Drop, the device breakdown voltage and the latch up current together compared with those of the related lateral IGBT 200. Moreover, when the depth of the trench 13 is particularly between 3 µm and 13 µm, namely, when the distance between the bottom of the trench 13 and the insulator film 2 is between 1 µm and 11 µm, little change is found in the electrical characteristics, by which favorable characteristics are exhibited. When the depth of the trench 13 is 14 µm, no current flows to make the device perform no function as the switching device. This is because the bottom of the trench 13 is brought into contact with the insulator film 2 to cause the emitter electrode 11 and the collector electrode 12 to be insulated from each other.

TABLE 1

(FIRST EMBODIMENT: THICKNESS OF N DRIFT LAYER @ 14 µM)

| DEPTH OF TRENCH (µM) | ON-STATE VOLTAGE DROP (V) | DEVICE BREAKDOWN VOLTAGE (V) | LATCH-UP CURRENT (A) |
|---|---|---|---|
| 1 | 1.95 | 225 | 3.80 |
| 2 | 1.92 | 235 | 3.90 |
| 3 | 1.91 | 245 | 4.10 |
| 4 | 1.91 | 245 | 4.09 |
| 5 | 1.90 | 246 | 4.11 |
| 6 | 1.90 | 246 | 4.09 |
| 7 | 1.85 | 246 | 4.27 |
| 8 | 1.85 | 248 | 4.28 |
| 9 | 1.84 | 248 | 4.29 |
| 10 | 1.84 | 248 | 4.30 |
| 11 | 1.84 | 248 | 4.29 |
| 12 | 1.87 | 249 | 4.29 |
| 13 | 1.87 | 250 | 4.31 |
| 14 | — | — | — |

Table 2 is a list of the results of measurements of relationships between the depth of the trench 13 and the electrical characteristics when the thickness of the n drift layer 3 is 8 µm in the semiconductor device 100 according to the first embodiment. The resistivity of the n drift layer 3 with the thickness of 8 µm is 7 Ωcm. The reason that the resistivity of the n drift layer 3 is different from that in the case with the thickness of 14 µm is for securing a breakdown voltage higher than desired one also in the case when the thickness of the n drift layer 3 is changed. In the case shown in Table 2, when the depth of the trench 13 is between 2 µm and 7 µm, namely, when the distance between the bottom of the trench 13 and the insulator film 2 is between 1 µm and 6 µm, little change is found in the electrical characteristics, by which favorable characteristics are exhibited. When the depth of the trench 13 is 8 µm, no current flows because the bottom of the trench 13 is brought into contact with the insulator film 2.

TABLE 2

(FIRST EMBODIMENT: THICKNESS OF N DRIFT LAYER @ 8 µM)

| DEPTH OF TRENCH (µM) | ON-STATE VOLTAGE DROP (V) | DEVICE BREAKDOWN VOLTAGE (V) | LATCH-UP CURRENT (A) |
|---|---|---|---|
| 1 | 1.92 | 220 | 3.80 |
| 2 | 1.90 | 242 | 4.15 |
| 3 | 1.90 | 245 | 4.16 |
| 4 | 1.90 | 246 | 4.15 |
| 5 | 1.89 | 246 | 4.15 |
| 6 | 1.86 | 248 | 4.20 |
| 7 | 1.85 | 249 | 4.22 |
| 8 | — | — | — |

Table 3 is a list of the results of measurements of relationships between the depth of the trench 13 and the electrical characteristics when the thickness of the n drift layer 3 is 16 µm in the semiconductor device 100 according to the first embodiment. The resistivity of the n drift layer 3 with the thickness of 16 µm is 15 Ωcm. In the case shown in Table 3, when the depth of the trench 13 is between 4 µm and 15 µm, namely, when the distance between the bottom of the trench 13 and the insulator film 2 is between 1 µm and 12 µm, little change is found in the electrical characteristics, by which favorable characteristics are exhibited. When the depth of the trench 13 is 16 µm, no current flows because the bottom of the trench 13 is brought into contact with the insulator film 2.

TABLE 3

(FIRST EMBODIMENT: THICKNESS OF N DRIFT LAYER @ 16 µM)

| DEPTH OF TRENCH (µM) | ON-STATE VOLTAGE DROP (V) | DEVICE BREAKDOWN VOLTAGE (V) | LATCH-UP CURRENT (A) |
|---|---|---|---|
| 1 | 1.92 | 220 | 3.50 |
| 2 | 1.90 | 225 | 3.66 |
| 3 | 1.90 | 230 | 3.99 |
| 4 | 1.90 | 244 | 4.12 |
| 5 | 1.89 | 246 | 4.15 |
| 6 | 1.86 | 248 | 4.20 |
| 7 | 1.85 | 249 | 4.22 |
| 8 | 1.85 | 249 | 4.28 |
| 9 | 1.84 | 249 | 4.29 |
| 10 | 1.84 | 249 | 4.30 |
| 11 | 1.84 | 249 | 4.29 |
| 12 | 1.89 | 250 | 4.29 |
| 13 | 1.95 | 252 | 4.31 |
| 14 | 1.93 | 254 | 4.33 |
| 15 | 1.93 | 255 | 4.33 |
| 16 | — | — | — |

Referring to Tables 4-6, the relationship between the distance from the bottom of the trench 13 to the insulator film 2 (trench to insulator film distance) and electrical characteristics when the distance from the bottom of the trench 13 to the insulator film 2 is finely changed in the semiconductor device 100 will be explained. Tables 4-6 are lists of the results of measurements of fine relationships between the trench to insulator film distance and the electrical characteristics when the thicknesses of the n drift layer 3 are 14 µm, 8 µm and 16 µm, respectively, in the semiconductor device 100 according to the first embodiment. As shown in Tables 4-6, when the distance from the trench 13 to the insulator film 2 is 1 µm or more, little change is found in the electrical characteristics, by which favorable characteristics are exhibited. While, when the distance from the bottom of the trench 13 to the insulator film 2 is less than 1 µm, sharp rising in the ON-state Voltage Drop is observed. This is because the voltage drop becomes remarkable in the region between the bottom of the trench 13 and the insulator film 2 with the distance between them becoming less than 1 µm.

TABLE 4

(FIRST EMBODIMENT: THICKNESS OF N DRIFT LAYER @ 14 µM)

| TRENCH TO INSULATOR FILM DISTANCE (µM) | ON-STATE VOLTAGE DROP (V) | DEVICE BREAKDOWN VOLTAGE (V) | LATCH-UP CURRENT (A) |
|---|---|---|---|
| 0.55 | 3.31 | 258 | 4.75 |
| 0.8 | 2.09 | 255 | 4.66 |
| 1 | 1.95 | 252 | 4.31 |
| 1.2 | 1.85 | 249 | 4.25 |

TABLE 5

(FIRST EMBODIMENT: THICKNESS OF N DRIFT LAYER @ 8 µM)

| TRENCH TO INSULATOR FILM DISTANCE (µM) | ON-STATE VOLTAGE DROP (V) | DEVICE BREAKDOWN VOLTAGE (V) | LATCH-UP CURRENT (A) |
|---|---|---|---|
| 0.55 | 3.08 | 258 | 4.65 |
| 0.8 | 2.05 | 255 | 4.60 |
| 1 | 1.85 | 249 | 4.22 |
| 1.2 | 1.85 | 249 | 4.25 |

TABLE 6

(FIRST EMBODIMENT: THICKNESS OF N DRIFT LAYER @ 16 µM)

| TRENCH TO INSULATOR FILM DISTANCE (µM) | ON-STATE VOLTAGE DROP (V) | DEVICE BREAKDOWN VOLTAGE (V) | LATCH-UP CURRENT (A) |
|---|---|---|---|
| 0.55 | 3.21 | 258 | 4.65 |
| 0.8 | 2.12 | 255 | 4.60 |
| 1 | 1.93 | 255 | 4.33 |
| 1.2 | 1.92 | 250 | 4.33 |

As explained above, the semiconductor device 100 has the structure in which the characteristics of the related vertical IGBT 230 are added to the related lateral IGBT 200. In general, in the vertical IGBT 230, when conducting current, the current in the device flows very uniformly. This makes the conductivity modulation in the drift layer uniform compared with that in the related lateral IGBT 200 to reduce the ON-state Voltage Drop. Moreover, by the insulator film filling in the drift layer, the breakdown voltage is carried in the vertical direction. This enables the necessary area of a unit cell smaller than that in the related lateral IGBT 200. Furthermore, in a comparison between a layer of semiconductor such as silicon and an insulator film, it is known that a voltage that can be carried with the same length without causing breakdown is sufficiently higher in the insulator film. Therefore, the device breakdown voltage is to be enhanced by a voltage carried by the insulator layer. In this way, in the semiconductor device 100, though it is a lateral device, current flows like in the vertical IGBT 230. This considerably enhances latch up current in comparison with that of the related lateral IGBT 200. Moreover, the distance between the trench 13 and the insulator film 2 is preferably 1 µm or more and 75% or less of the thickness of the n drift layer 3.

Figure 9:
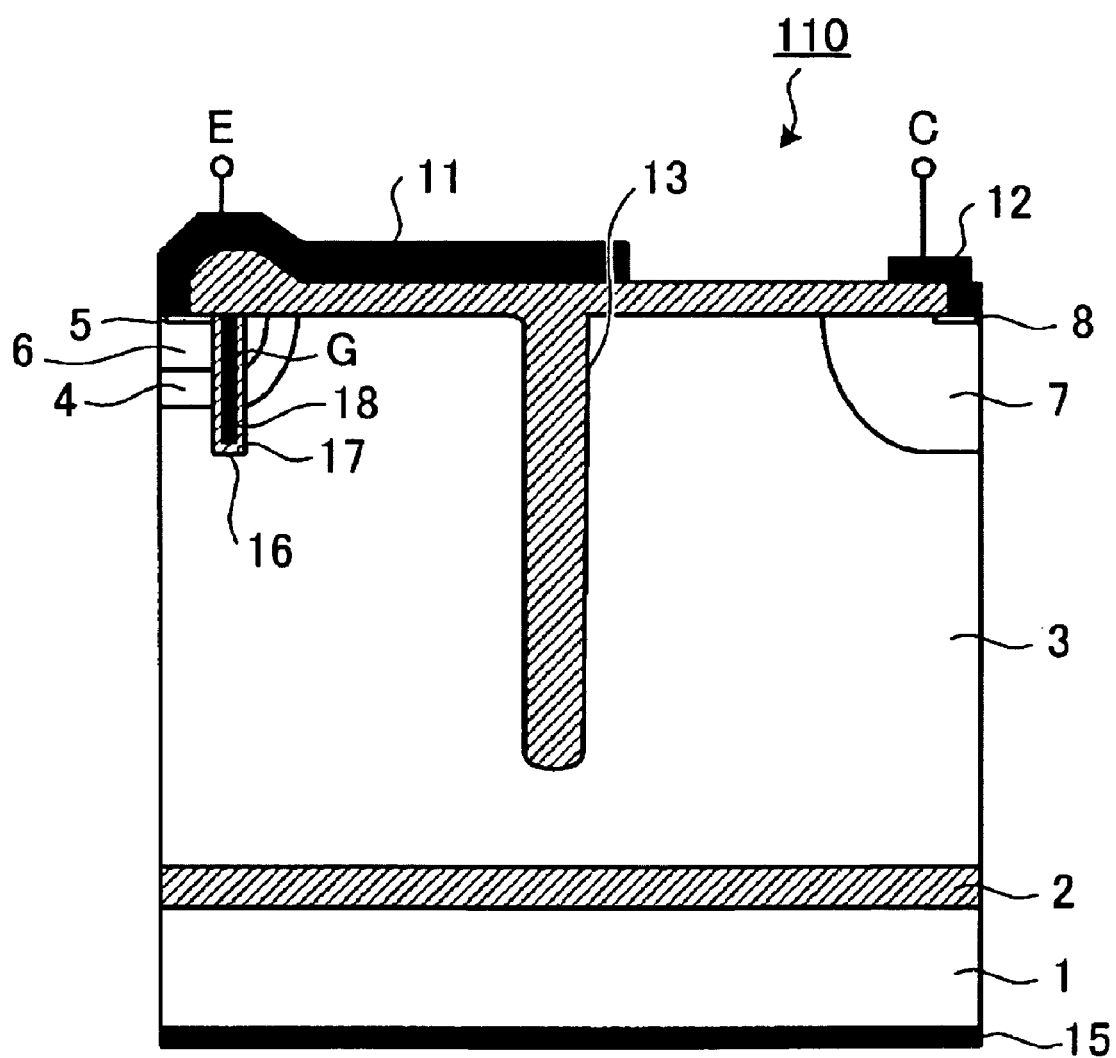
FIG. 9 schematically illustrates a cross-sectional view of a second embodiment of the structure of the semiconductor device according to the present invention.

Referring to FIG. 9, a semiconductor device 110 according to the second embodiment will be explained. The semiconductor device 110, which has a lateral IGBT structure, is similar to the semiconductor device 100 according to the first embodiment, except that it further includes a gate electrode with a trench gate structure. In the semiconductor device 110 shown in FIG. 9, a gate trench 16 penetrates through the p base layer 4 and reaches the n drift layer 3. The gate trench 16 has a width of 0.8 µm and a depth of 3.0 µm, for example. In the gate trench 16, an oxide film 17 with a thickness of the order of 20 nm is provided. Moreover, the gate trench 16 is filled with polysilicon, for example. The polysilicon becomes a trench gate electrode 18. The gate trench 16 partitions the p base layer 4. In the second embodiment, the p base layer 4 closer to the collector electrode (12) side is spaced apart from the emitter electrode 11. While not explicitly illustrated in FIG. 9, this embodiment can include the gate electrode (9) structure similarly as configured in FIG. 2 and connected to the trench gate electrode.

Figure 10:
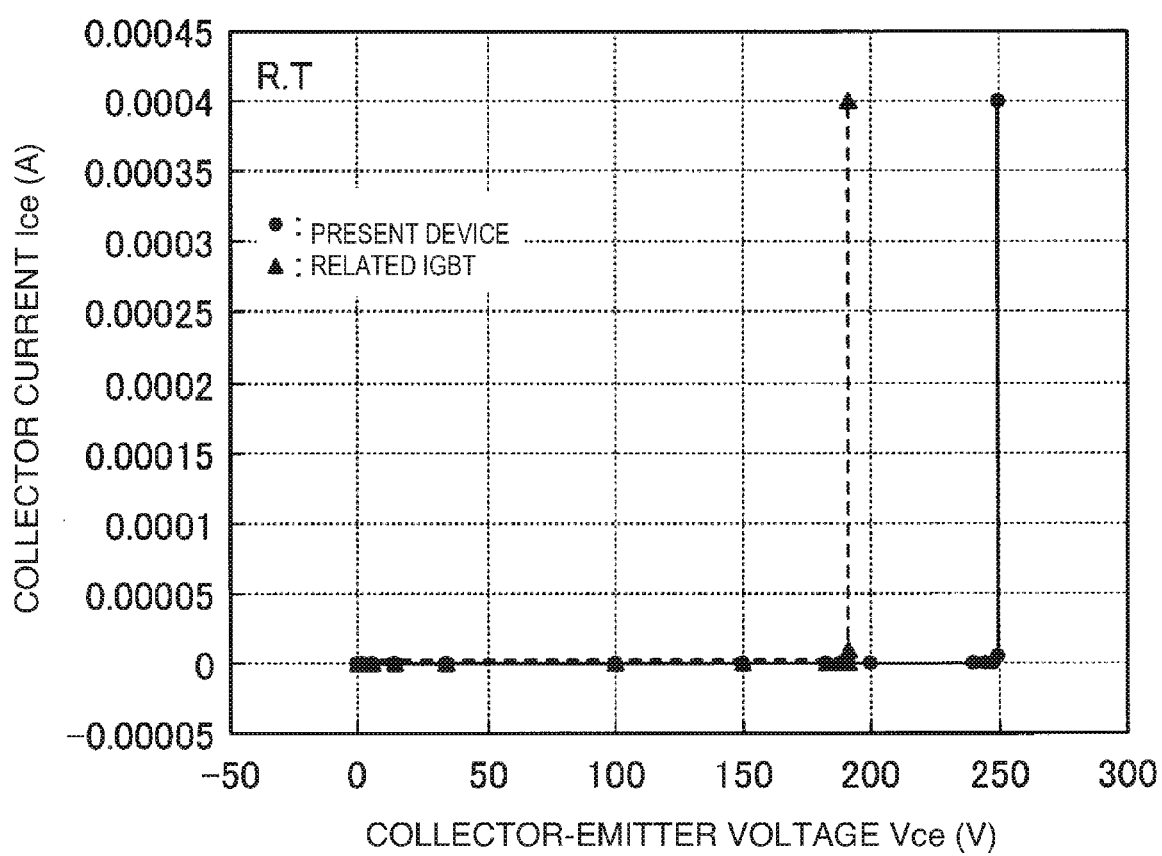
FIG. 10 is a characteristic diagram illustrating the device breakdown voltage characteristic of each of the semiconductor device according to the second embodiment and the related lateral IGBT.

Referring to FIG. 10, the device breakdown voltages of the semiconductor device 110 and the related lateral IGBT 200 will be explained. FIG. 10 is a characteristic diagram showing the device breakdown voltage characteristic of each of the semiconductor device 110 according to the second embodiment and the related lateral IGBT 200. In FIG. 10, the vertical axis represents the collector current Ice and the horizontal axis represents the collector-emitter voltage Vce. The plots with the marks ● and ▲ show the characteristics of the semiconductor device 110 and the related lateral IGBT 200, respectively. The thickness, resistivity, diffusion depth and impurity concentration of each of the layers in the semiconductor device 110 are the same as those in the semiconductor device 100. Moreover, the semiconductor device 110, like the semiconductor device 100 and the related lateral IGBT 200, is made to have an active area of 106 µm×670 µm and a rated current of 0.4 A, for example. The cell pitch of the semiconductor device 110 becomes smaller as 15.0 µm by the length changed for applying the trench gate structure, by which the cell pitch becomes 4.5 µm shorter compared with the cell pitch (19.5 µm) of the semiconductor device 100. As shown in FIG. 10, the device breakdown voltage of the semiconductor device 110 becomes 249V, which is increased by +55V (+31%) in comparison with the device breakdown voltage (190V) of the related lateral IGBT 200.

Figure 11:
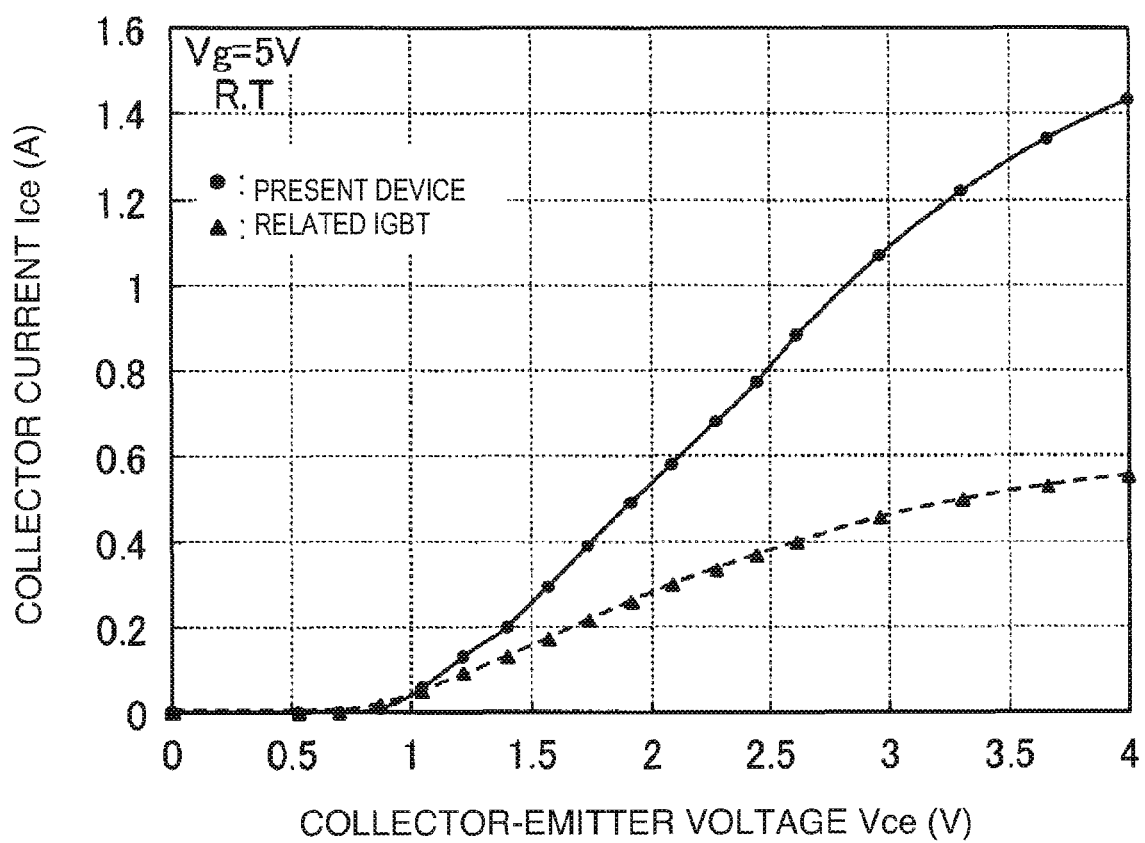
FIG. 11 is a characteristic diagram illustrating the I-V characteristic curve of the current conduction characteristic of each of the semiconductor device according to the second embodiment and the related lateral IGBT.

Referring to FIG. 11, the I-V characteristic curves of the current conduction characteristics of the semiconductor device 110 and the related lateral IGBT 200 will be explained. FIG. 11 is a characteristic diagram showing the I-V characteristic curve of the current conduction characteristic of each of the semiconductor device 110 and the related lateral IGBT 200. In FIG. 11, the vertical axis represents the collector current Ice and the horizontal axis represents the collector-emitter voltage Vce. The plots with the marks ● and ▲ show the characteristics of the semiconductor device 110 and the related lateral IGBT 200, respectively. As shown in FIG. 11, the collector-emitter voltage Vce of the semiconductor device 110 when the collector current Ice of 0.4 A flows, i.e., the ON-state Voltage Drop of the semiconductor device 110, is 1.79V. The ON-state Voltage Drop of the semiconductor device 110 is reduced by 0.81V in comparison with the ON-state Voltage Drop (2.60V) of the related lateral IGBT 200. Moreover, when the collector-emitter voltage Vce is given as Vce=2.6V, for example, the collector current Ice of the semiconductor device 110 becomes 0.88 A, which increases by 120.0% compared with the collector current Ice (0.4 A) of the related lateral IGBT 200. Therefore, it is known that the current conduction capability is significantly enhanced. Moreover, the load short-circuit blocking capability was presented as being 20 µsec or more.

Referring to Table 7, the relationship between the depth of the trench 13 and electrical characteristics in the semiconductor device 110 according to the second embodiment will be explained. Table 7 is a list of the results of measurements of relationships between the depth of the trench 13 and the electrical characteristics in the semiconductor device 110. In Table 7, when the depth of the trench 13 is between 1 μm and 13 μm, the semiconductor device 110 is improved in the ON-state Voltage Drop, the device breakdown voltage and the latch up current together compared with those of the related lateral IGBT 200. Moreover, when the depth of the trench 13 is particularly between 3 μm and 13 μm, namely, when the distance between the bottom of the trench 13 and the insulator film 2 is between 1 μm and 7 μm, little change is found in the electrical characteristics, by which favorable characteristics are exhibited. Furthermore, as a result of measurements of relationships between the depth of the trench 13 and the electrical characteristics carried out when the thickness of the n drift layer 3 is 8 μm or 16 μm, like in Tables 2 and 3 for the semiconductor device 100 according to the first embodiment, similar results are obtained.

TABLE 7

(SECOND EMBODIMENT: THICKNESS OF N DRIFT LAYER @ 14 μM)

| DEPTH OF TRENCH (μM) | ON-STATE VOLTAGE DROP (V) | DEVICE BREAKDOWN VOLTAGE (V) | LATCH-UP CURRENT (A) |
| --- | --- | --- | --- |
| 1 | 1.94 | 220 | 3.82 |
| 2 | 1.89 | 229 | 3.92 |
| 3 | 1.89 | 245 | 4.08 |
| 4 | 1.89 | 246 | 4.09 |
| 5 | 1.89 | 247 | 4.10 |
| 6 | 1.87 | 247 | 4.09 |
| 7 | 1.80 | 248 | 4.29 |
| 8 | 1.80 | 249 | 4.30 |
| 9 | 1.79 | 249 | 4.31 |
| 10 | 1.79 | 249 | 4.31 |
| 11 | 1.78 | 249 | 4.30 |
| 12 | 1.79 | 250 | 4.31 |
| 13 | 1.80 | 251 | 4.31 |
| 14 | — | — | — |

As explained above, according to the semiconductor device 110, the gate electrode structure is formed with a trench gate type. In the trench gate type structure, the dimensions of a unit cell can be made smaller compared with those in a planar gate type. Therefore, an ON-state Voltage Drop and a current conduction capability can be made further enhanced. This enables the semiconductor device 110 to have a chip area made smaller than that of the semiconductor device 100 with the electrical characteristics of the semiconductor device 100 maintained.

Figure 12:
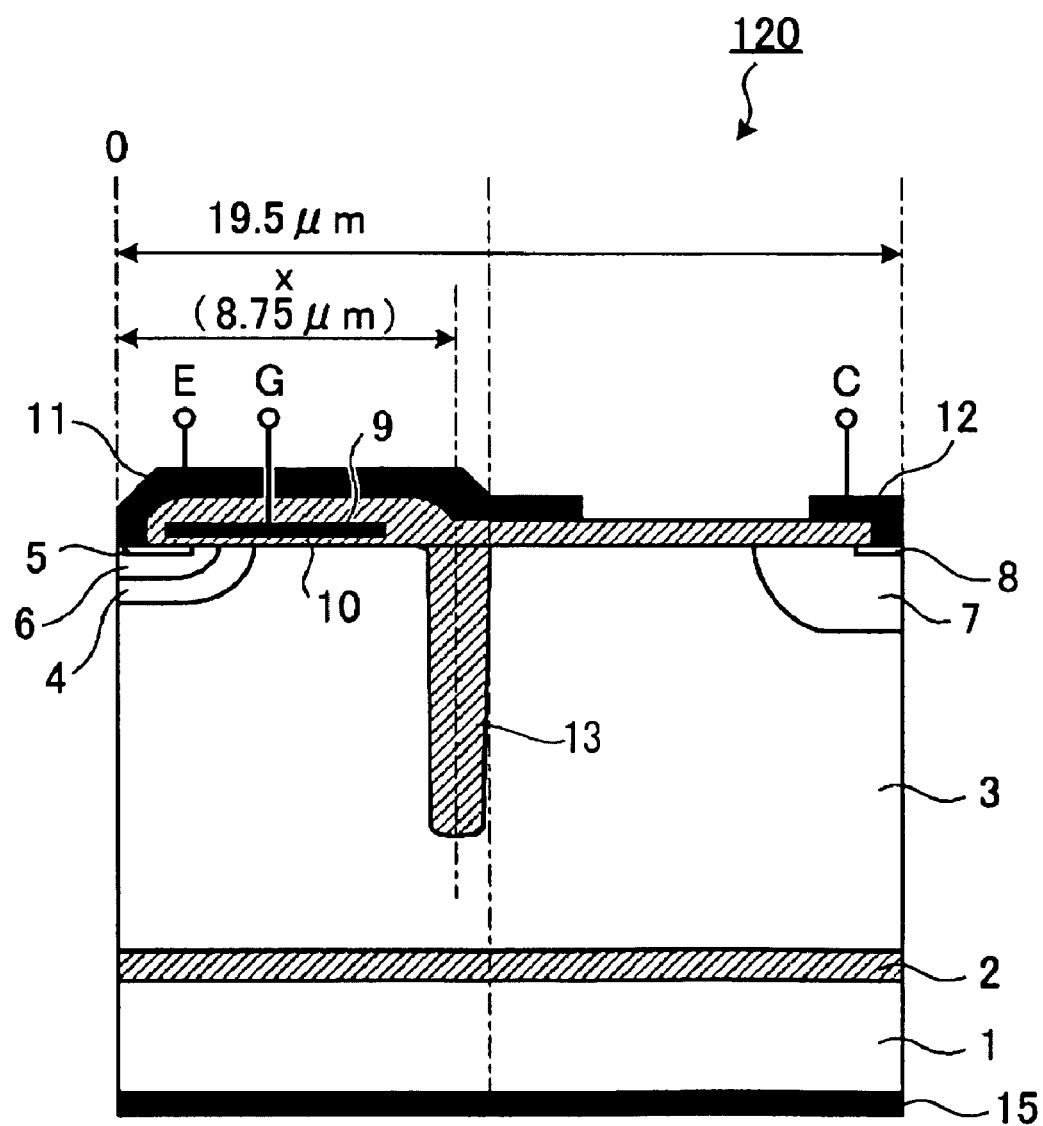
FIG. 12 schematically illustrates a cross-sectional view of a third embodiment of the structure of the semiconductor device according to the present invention.

Referring to FIG. 12, a semiconductor device 120 according to the third embodiment will be explained. The semiconductor device 120, which has a lateral IGBT structure, is similar to the semiconductor device 100 or 110 according to the first or second embodiment, except that the center line of the trench 13 is offset (i.e., not coinciding with) from the center line of the unit cell. In the semiconductor device 120 shown in FIG. 12, when the device 120 is formed with the specific unit cell pitch taken as 19.5 μm, the center line of the trench 13 is positioned 8.75 μm from the center of the emitter electrode 11.

As a result of the measurement with a collector current Ice taken as Ice=0.4 A at room temperature (25° C.), the device breakdown voltage becomes 246V and the ON-state Voltage Drop becomes 1.89V. Moreover, as a result of the measurement with a collector-emitter voltage Vce taken as Vce=2.60V at a room temperature (25° C.), the current conduction capability Ice becomes 0.77 A. Furthermore, as a result of the measurement with a collector-emitter voltage Vce taken as Vce=200V at a room temperature (25° C.), the load short-circuit blocking capability becomes 20 μsec or more. It is known that all of them are largely enhanced compared with those of the related lateral IGBT 200.

Referring to Table 8, the electrical characteristics in the semiconductor device 120 according to the third embodiment, when the distance X from the center of the emitter electrode 11 to the center line of the trench 13 is changed, will be explained. Table 8 is a list of the electrical characteristics when the distance X from the center of the emitter electrode 11 to the center line of the trench 13 is changed in the semiconductor device 120. As shown in Table 8, within the range in which X is between 6.5 μm and 13.0 μm, the device breakdown voltages and the ON-state Voltage Drops exhibit favorable values in comparison with those in the related lateral IGBT 200. Here, the distance X at 6.5 μm is one-third the cell pitch and the distance X at 13.0 μm is two-thirds the cell pitch. Therefore, it is known that at a distance between one-third and two-thirds the cell pitch from the center of the emitter electrode 11, the device breakdown voltages and the ON-state Voltage Drops exhibit favorable values in comparison with those in the related lateral IGBT 200. Moreover, the load short-circuit blocking capability of the device when the distance X at 13.0 μm was 20 μsec or more.

TABLE 8

(THIRD EMBODIMENT)

| CENTER OF EMITTER ELECTRODE TO CENTER OF TRENCH DISTANCE X (μM) | ON-STATE VOLTAGE DROP (V) | DEVICE BREAKDOWN VOLTAGE (V) | LATCH-UP CURRENT (A) |
| --- | --- | --- | --- |
| 2.5 | — | — | — |
| 3.5 | — | — | — |
| 4.5 | 2.25 | 229 | 4.29 |
| 6.5 | 1.89 | 245 | 4.30 |
| 8.0 | 1.89 | 249 | 4.32 |
| 8.75 | 1.89 | 249 | 4.32 |
| 9.75 | 1.84 | 248 | 4.30 |
| 10.5 | 1.84 | 249 | 4.30 |
| 11.5 | 1.83 | 249 | 4.31 |
| 12.5 | 1.82 | 249 | 4.31 |
| 13.0 | 1.83 | 249 | 4.30 |
| 14.0 | 2.03 | 222 | 4.31 |
| 15.0 | 2.15 | 215 | 4.31 |
| 16.0 | 2.25 | 200 | 4.33 |

Incidentally, as shown in Table 8, no ON-state Voltage Drop was measured when the distances X are at 2.5 μm and 3.5 μm. This is because the trench 13 was brought into contact with the p base layer 4. In this case, no electron current from the MOSFET section reaches the n drift layer 3, making the device impossible to carry out the IGBT operation.

As explained above, according to the semiconductor device 120 according to the third embodiment, by forming the trench 13 in the region between one-third and two-thirds the distance from the center of the emitter electrode 11 to the center of the collector electrode, it is made possible to reduce the ON-state Voltage Drop and enhance the device breakdown voltage.

Figure 13:
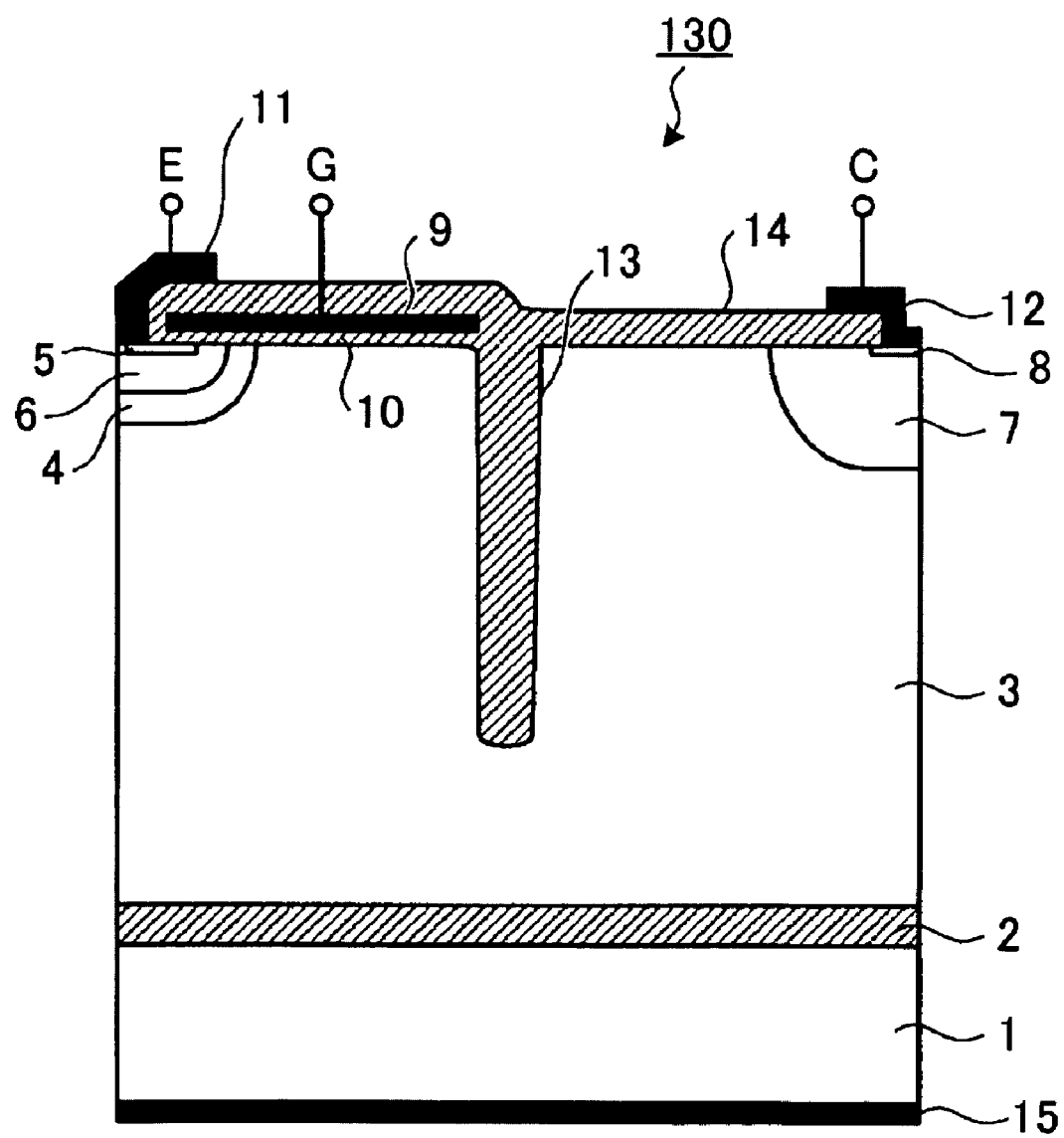
FIG. 13 schematically illustrates a cross-sectional view of a fourth embodiment of the structure of the semiconductor device according to the present invention.

Referring to FIG. 13, the structure of a semiconductor device 130 according to the fourth embodiment will be explained. The semiconductor device 130, which has a lateral IGBT structure, is similar to the semiconductor device 100, 110, or 120 according to the first, second, or third embodiment except in the lengths of the gate electrode 9 and the emitter electrode 11. Specifically, the gate electrode 9 extends to the position directly above the emitter side end of the trench 13. Moreover, in the fourth embodiment, the emitter electrode 11 extends to about above the p base layer 4. Moreover, in the fourth embodiment, the trench 13 can be formed before the constituents of the MOSFET section, such as the gate oxide film 10 and the gate electrode 9, are formed. After the trench 13 is then filled with the oxide film 14, the MOSFET section can be formed.

The electrical characteristics of the semiconductor device 130 exhibit values approximately equivalent to those of the electrical characteristics of the semiconductor device 100 according to the first embodiment. Therefore, in the semiconductor device 130, the electrical characteristics are largely enhanced compared with those in the related lateral IGBT 200. As explained above, in the semiconductor device 130, when a high voltage is applied to the collector electrode 12, electric field strength at the junction of the p base layer 4 and the n drift layer 3 can be reduced. This makes it possible to carry the device breakdown voltage.

Figure 14:
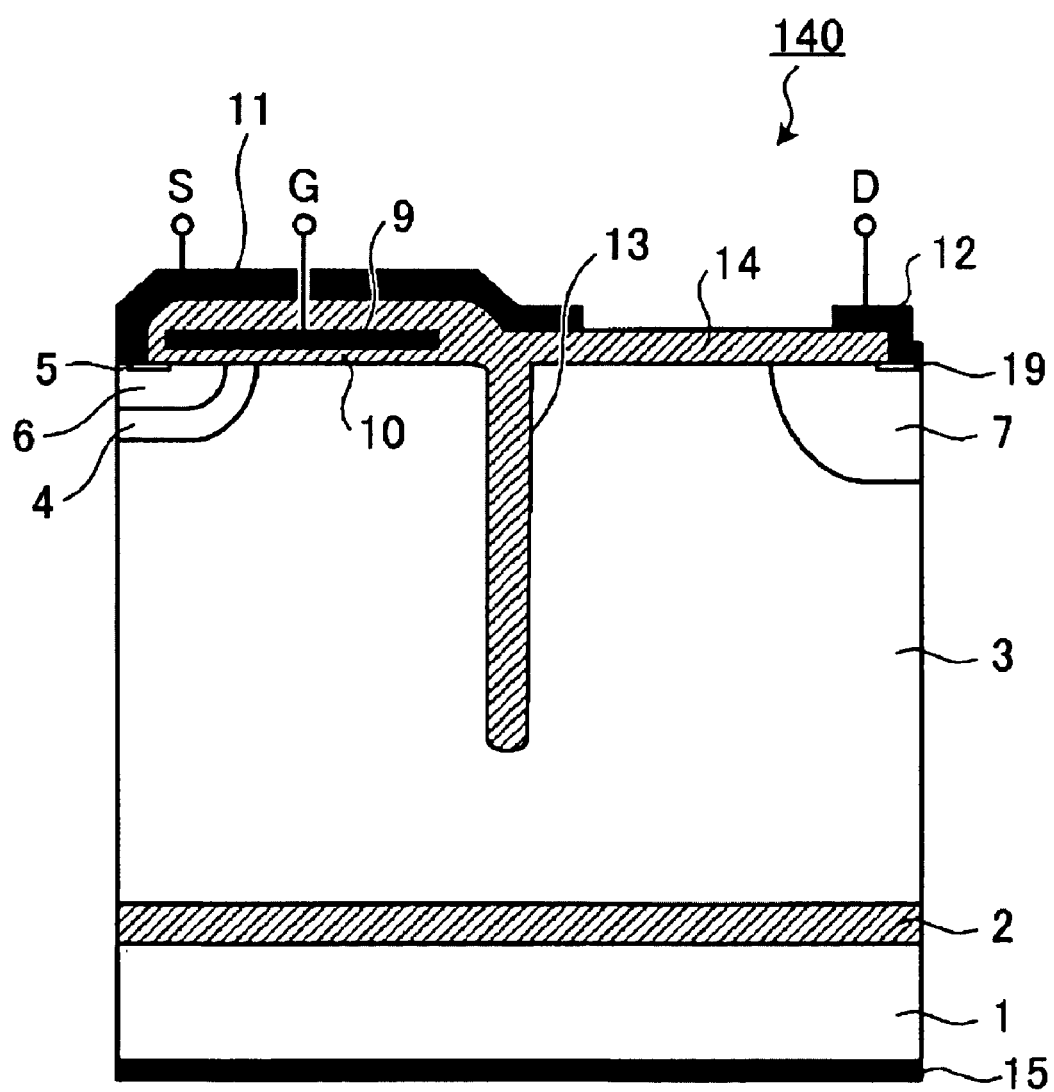
FIG. 14 schematically illustrates a cross-sectional view of a fifth embodiment of the structure of the semiconductor device according to the present invention.
Figure 15:
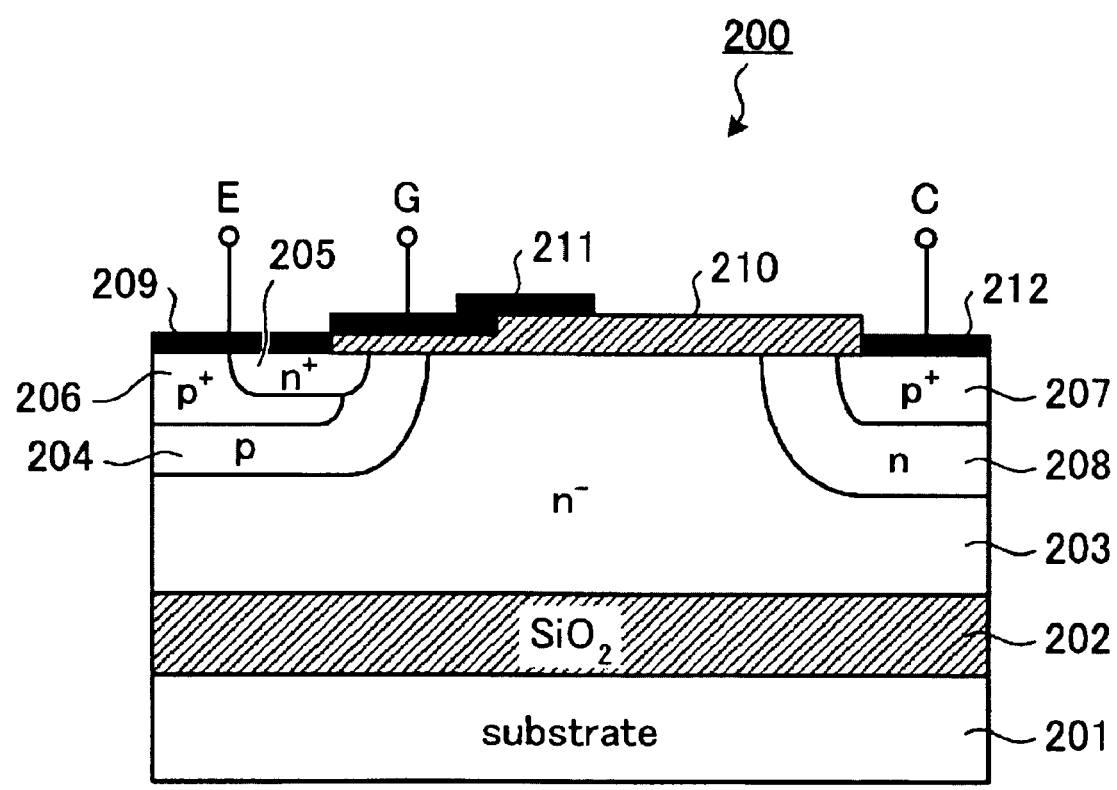
FIG. 15 schematically illustrates a cross-sectional view of the structure of the related lateral IGBT.
Figure 16:
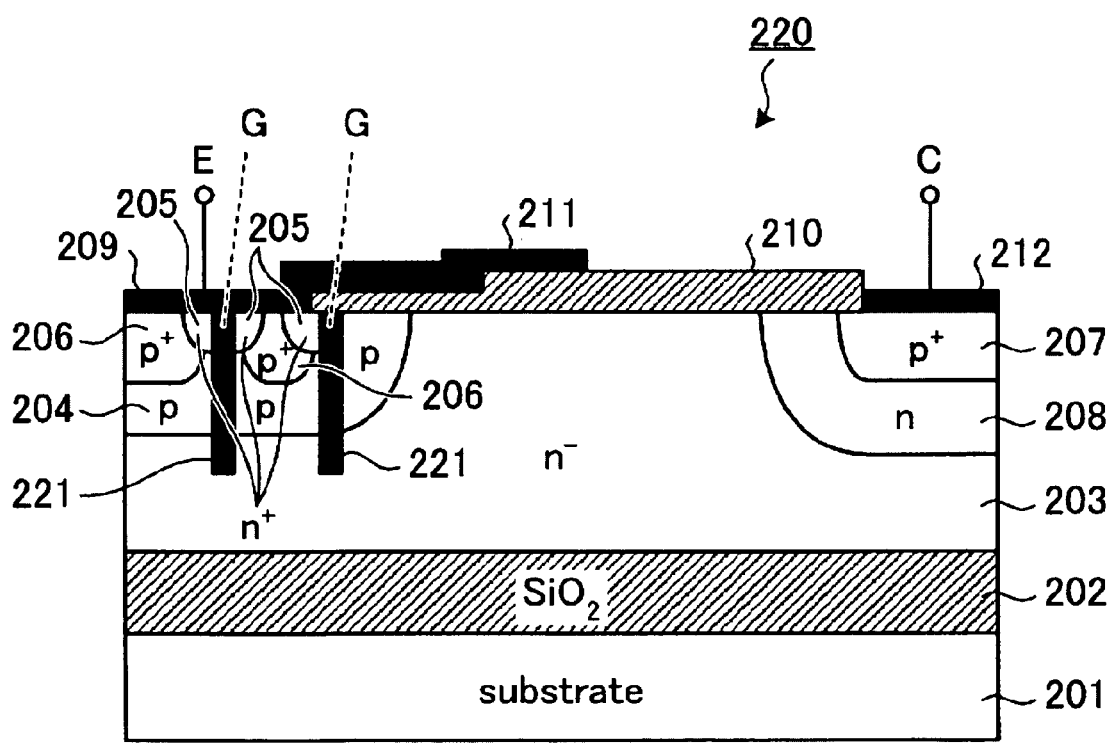
FIG. 16 schematically illustrates a cross-sectional view of the structure of a lateral IGBT with its gate electrode section is to be a trench gate.

Referring to FIG. 14, the structure of a semiconductor device 140 according to the fifth embodiment will be explained. The semiconductor device 140 is similar to the semiconductor devices 100, 110, 120, or 130 according to the previous embodiments, except that in part of the surface layer of the n buffer layer 7, an n$^+$ drain layer 19 is provided rather than the p collector layer 8. For example, the n$^+$ drain layer 19 can have a diffusion depth of 0.2 μm and an impurity concentration of $3.0 \times 10^{20}$ cm$^{-3}$. Therefore, the semiconductor device 140 has a lateral MOSFET structure. Here, the collector in the IGBT structure is referred to as a drain in the MOSFET structure. Moreover, the emitter in the IGBT structure is referred to as a source in the MOSFET structure. Although they are referred to with different names, have the same structures. In the specification, the source is denoted by the same reference numeral as that of the emitter. Each of the layers other than the n$^+$ drain layer 19 can have the thickness, the resistivity, the diffusion depth, and the impurity concentration similar to those in the semiconductor device 100 according to the first embodiment.

The breakdown voltage of the semiconductor device 140 becomes 260V. Therefore, the device breakdown voltage of the semiconductor device 140 is enhanced by 65V (33%) in comparison with the device breakdown voltage (195V) of a related lateral MOSFET in which the conductivity type of the p$^+$ collector region 207 in the related lateral IGBT 200 is changed to the n$^+$-type. The n$^+$ drain layer in the related lateral MOSFET has a diffusion depth and an impurity concentration made similar to those of the semiconductor device 140. The on-resistance RonA of the semiconductor device 140 becomes 13 mΩcm$^2$, which is reduced by 28% in comparison with the on-resistance RonA (18 mΩcm$^2$) of the related lateral MOSFET. The same is true in the case of the device with the trench gate structure.

As explained above, in the semiconductor device 140 according to the fifth embodiment, even with the lateral MOSFET structure, the same advantages as those of the semiconductor devices (lateral IGBTs) 100, 110, 120n and 130 according to the previous embodiments can be obtained.

As described above, the semiconductor device according to the present invention is useful for a high voltage switching device. In particular, the device is suited for a high voltage switching device used at an output stage of a driver IC in a flat panel display, such as a plasma display, or for an IC for a vehicle.

The present semiconductor devices provide the characteristics of both the vertical semiconductor device and the lateral semiconductor device. This allows a considerably uniform current flow in the device to reduce the ON-state Voltage Drop. Moreover, by the insulator film filling the inside of the trench, the device breakdown voltage can be carried in the vertical direction. Thus, the device breakdown voltage can be enhanced while allowing the necessary area of the unit cell to be smaller. In addition, current flows like in a vertical semiconductor device to thereby enhance latch up current. Furthermore, the distance between the bottom of the trench provided in the drift layer and the insulator film on the substrate can be 1 μm or more and 75% or less of the thickness of the drift layer.

The present embodiments do not require a component, such as a field plate, in the trench, so that the structure of the device becomes simple. Therefore, the device can be fabricated easily. Moreover, the gate electrode can be provided in the gate trench that penetrates through the base layer beneath the emitter later or the source layer and reach the drift layer, so that the cell pitch can be shortened. Therefore, while inhibiting an increase of the ON-state Voltage Drop, the breakdown voltage can be enhanced. Moreover, the trench can be provided so that its central position is within a range between one-third and two-thirds of the distance from the central position of the emitter electrode to the central position of the collector electrode or of the distance from the central position of the source electrode to the central position of the drain electrode. Thus, it is possible to lower the ON-state Voltage Drop while enhancing the device breakdown voltage and latch up current. Moreover, by setting the depth of the trench provided in the drift layer to be within a suitable range, the ON-state Voltage Drop can be lowered and the device breakdown voltage and latch up current can be made higher.

While the present invention has been particularly shown and described with reference to preferred embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on and claims priority to Japanese Patent Application 2007-152015 filed on 7 Jun. 2007. The disclosure of the priority application in its entirety, including the drawings, claims, and the specification thereof, is incorporated herein by reference.

What is claimed is:

1. A semiconductor device comprising:
   a substrate;
   a drift layer of a first conductivity type on the substrate with a first insulator film therebetween;
   a base layer of a second conductivity type in the drift layer;
   a first layer of the first conductivity type in the base layer;
   a gate electrode over the surface of the base layer, between the drift layer and the first layer with a gate insulator film therebetween;
   a second insulator film, a portion of the second insulator film disposed on a surface of the drift layer;

a first electrode electrically connected to both the base layer and the first layer, a portion of the first electrode being disposed on the second insulator film;

a buffer layer of the first conductivity type in the drift layer and spaced apart from the base layer;

a second layer of one of the first or second conductivity type in the buffer layer;

a second electrode electrically connected to the second layer; and a trench between the base layer and the second layer, wherein the trench is filled with the second insulator film, and wherein the distance between the bottom of the trench and the insulator film on the substrate being 1 µm or more and 75% or less of the thickness of the drift layer;

wherein the first layer is an emitter layer, the second layer is a collector layer of the second conductivity type, the first electrode is an emitter electrode, and the second electrode is a collector electrode;

wherein the emitter electrode extends from one side of the trench, over and across the trench, to the other side of the trench; and wherein the emitter electrode is not directly electrically connected to the drift layer and the emitter electrode is not directly electrically connected to the buffer layer.

2. The semiconductor device according to claim 1, further including a gate trench penetrating through the base layer beneath the first layer and reaching the drift layer.

3. The semiconductor device according to claim 2, wherein the first layer is a source layer, the second layer is a drain layer of the first conductivity type, the first electrode is a source electrode, and the second electrode is a drain electrode.

4. The semiconductor device according to claim 3, wherein a center line of the trench is positioned within a range between one-third and two-thirds of the distance between a central position of the source electrode and a central position of the drain electrode.

5. The semiconductor device according to claim 3, wherein at least one of the gate electrode or the source electrode extends to the trench from above the trench.

6. The semiconductor device according to claim 1, wherein the first layer is an emitter layer, the second layer is a collector layer of the second conductivity type, the first electrode is an emitter electrode, and the second electrode is a collector electrode.

7. The semiconductor device according to claim 6, wherein a center line of the trench is positioned within a range between one-third and two-thirds of the distance between a central position of the emitter electrode and a central position of the collector electrode.

8. The semiconductor device according to claim 6, wherein at least one of the gate electrode or the emitter electrode extends to the trench from above the trench.

9. The semiconductor device according to claim 1, wherein the first layer is a source layer, the second layer is a drain layer of the first conductivity type, the first electrode is a source electrode, and the second electrode is a drain electrode.

10. The semiconductor device according to claim 9, wherein a center line of the trench is positioned within a range between one-third and two-thirds of the distance between a central position of the source electrode and a central position of the drain electrode.

11. The semiconductor device according to claim 9, wherein at least one of the gate electrode or the source electrode extends to the trench from above the trench.

12. The semiconductor device according to claim 1, wherein a center line of the trench is positioned within a range between one-third and two-thirds of the distance between a central position of the emitter electrode and a central position of the collector electrode.

13. The semiconductor device according to claim 1, wherein the trench is spaced from the base layer.

14. The semiconductor device according to claim 1, wherein the insulator film filling the trench is a silicon oxide film.

15. The semiconductor device according to claim 1, wherein the gate insulator film is a silicon oxide film.

16. The semiconductor device according to claim 1, wherein each of the substrate, the drift layer, the base layer, the first layer, the buffer layer, and the second layer is made of silicon.

17. A method of manufacturing a semiconductor device comprising the steps of:

providing a substrate;

forming a first insulator film on the substrate;

forming a drift layer of a first conductivity type on the insulator film;

forming a base layer of a second conductivity type in the drift layer;

forming a first layer of the first conductivity type in the base layer;

forming a gate electrode over the surface of the base layer, between the drift layer and the first layer with a gate insulator film therebetween;

forming a second insulator film, a portion of the second insulator film disposed on a surface of the drift layer;

forming a first electrode electrically connected to both the base layer and the first layer, a portion of the first electrode being disposed on the second insulator film;

forming a buffer layer of the first conductivity type in the drift layer and spaced apart from the base layer;

forming a second layer of one of the first or second conductivity type in the buffer layer;

forming a second electrode electrically connected to the second layer; and forming a trench between the base layer and the collector layer;

filling the trench with the second insulator film, wherein the distance between the bottom of the trench and the insulator film on the substrate being 1 µm or more and 75% or less of the thickness of the drift layer;

wherein the first layer is an emitter layer, the second layer is a collector layer of the second conductivity type, the first electrode is an emitter electrode, and the second electrode is a collector electrode;

wherein the emitter electrode extends from one side of the trench, over and across the trench, to the other side of the trench; and wherein the emitter electrode is not directly electrically connected to the drift layer and the emitter electrode is not directly electrically connected to the buffer layer.

18. The method according to claim 17, further including the step of forming a gate trench penetrating through the base layer beneath the first layer and reaching the drift layer.

* * * * *